(12) United States Patent
Padmanabhan et al.

(10) Patent No.: US 11,871,132 B2
(45) Date of Patent: Jan. 9, 2024

(54) DEVICES AND METHODS FOR OBTAINING THREE-DIMENSIONAL SHAPE INFORMATION USING POLARIZATION AND TIME-OF-FLIGHT DETECTION PIXEL CELLS

(71) Applicant: OMNIVISION TECHNOLOGIES, INC., Santa Clara, CA (US)

(72) Inventors: Badrinath Padmanabhan, San Jose, CA (US); Boyd Fowler, Sunnyvale, CA (US); Alireza Bonakdar, San Jose, CA (US); Richard Mann, Santa Clara, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 231 days.

(21) Appl. No.: 16/870,687

(22) Filed: May 8, 2020

(65) Prior Publication Data

US 2021/0352234 A1    Nov. 11, 2021

(51) Int. Cl.
*H04N 25/705*    (2023.01)
*H01L 27/146*    (2006.01)
(Continued)

(52) U.S. Cl.
CPC ..... *H04N 25/705* (2023.01); *H01L 27/14609* (2013.01); *H01L 27/14643* (2013.01); *H04N 25/75* (2023.01); *H04N 25/778* (2023.01)

(58) Field of Classification Search
CPC .......................... H04N 5/36965; G01S 7/4865
See application file for complete search history.

(56) References Cited

U.S. PATENT DOCUMENTS 5,890,095 A    3/1999  Barbour et al.
9,523,765 B2  12/2016  Sun et al.
(Continued)

OTHER PUBLICATIONS

Yoshida T, Golyanik V, Wasenmüller O, Stricker D. Improving Time-of-Flight Sensor for Specular Surfaces with Shape from Polarization. In 2018 25th IEEE International Conference on Image Processing (ICIP) Oct. 7, 2018 (pp. 1558-1562). IEEE. (Year: 2018).*

(Continued)

*Primary Examiner* — Clifford Hilaire
(74) *Attorney, Agent, or Firm* — Christensen O'Connor Johnson Kindness PLLC

(57) ABSTRACT

In some embodiments, an imaging system is provided. The imaging system comprises an image sensor, a light source, control circuitry, and function logic. The image sensor comprises a pixel array that includes a plurality of polarization pixel cells and a plurality of time-of-flight pixel cells. The light source is configured to emit light pulses to an object. The control circuitry is coupled to the light source and the pixel array, and is configured to synchronize a timing of the emission of the light pulses with sensing of photons reflected from the object by the plurality of time-of-flight pixel cells to generate depth information. The function logic is configured to determine a set of ambiguous surface normals using signals generated by the plurality of polarization pixel cells, and to disambiguate the set of ambiguous surface normals using the depth information to generate a three-dimensional shape image.

5 Claims, 14 Drawing Sheets

(51) Int. Cl.
*H04N 25/75* (2023.01)
*H04N 25/778* (2023.01)

(56) References Cited

U.S. PATENT DOCUMENTS

| | | |
|---|---|---|
| 10,260,866 B2 | 4/2019 | Kadambi et al. |
| 2012/0105823 A1* | 5/2012 | Hardegger ............ G01S 17/894 |
| | | 356/6 |
| 2016/0010986 A1* | 1/2016 | Sun ....................... G01S 17/894 |
| | | 356/5.01 |
| 2016/0261844 A1* | 9/2016 | Kadambi ................ G06T 7/507 |
| 2020/0103511 A1* | 4/2020 | Jin ........................ G01S 17/894 |
| 2020/0182988 A1* | 6/2020 | Pau ....................... G01S 7/4814 |
| 2021/0325541 A1* | 10/2021 | Kim ....................... H04N 5/379 |

OTHER PUBLICATIONS

Nayar SK, Fang XS, Boult T. Separation of reflection components using color and polarization. International Journal of Computer Vision. Feb. 1997;21(3): 163-86. (Year: 1997).*

* cited by examiner

FIG. 4

DEVICES AND METHODS FOR OBTAINING THREE-DIMENSIONAL SHAPE INFORMATION USING POLARIZATION AND TIME-OF-FLIGHT DETECTION PIXEL CELLS

BACKGROUND INFORMATION

Field of the Disclosure

This disclosure relates generally to image sensors, and in particular but not exclusively, relates CMOS image sensors and applications thereof.

Background Information

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. To easily identify the discussion of any particular element or act, the most significant digit or digits in a reference number refer to the figure number in which that element is first introduced.

FIG. 4 is a schematic drawing that illustrates yet another non-limiting example embodiment of a pixel array pattern according to various aspects of the present disclosure.

Figure 1:
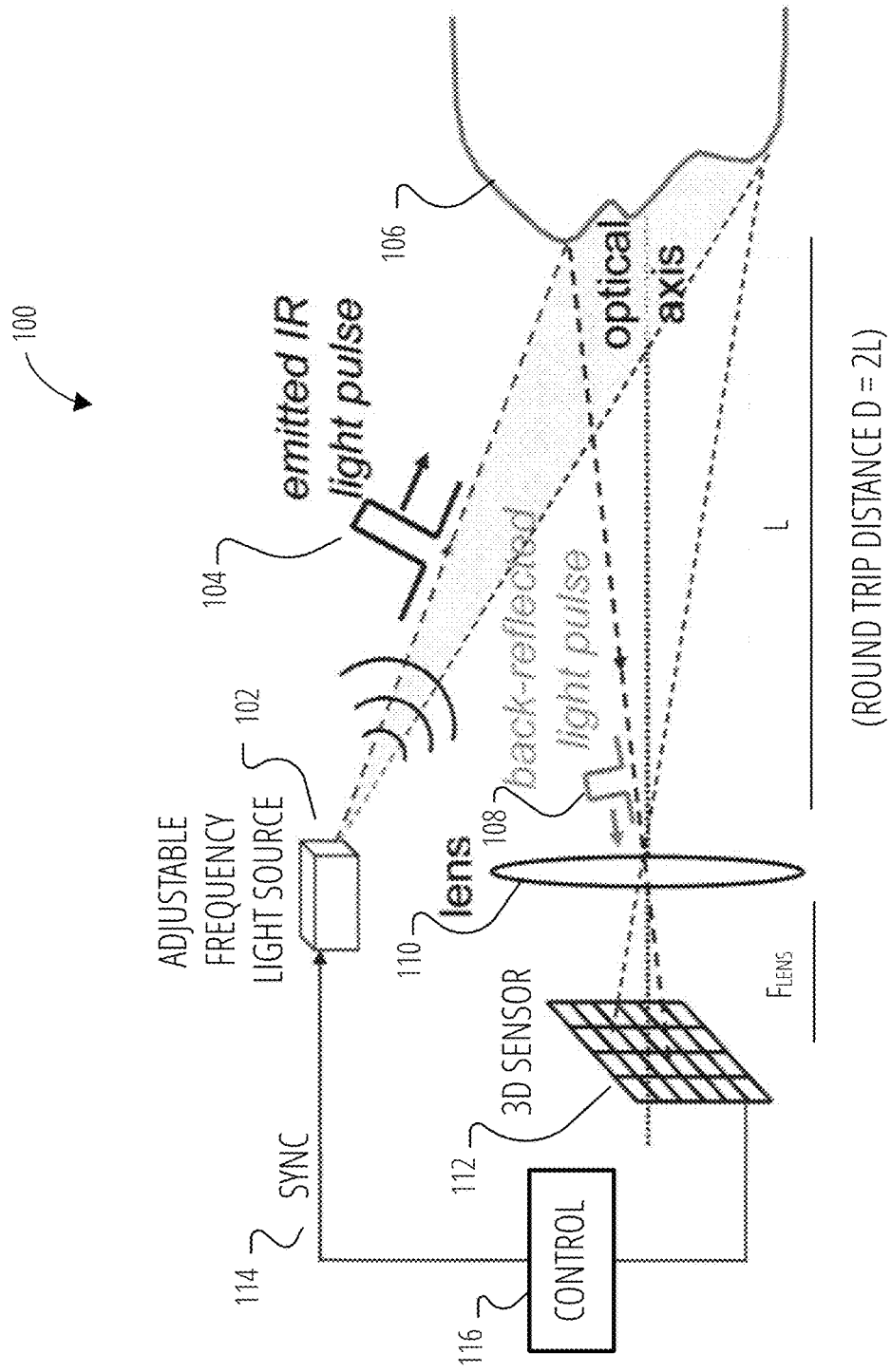
FIG. 1 is a block diagram that shows a non-limiting example embodiment of a time-of-flight sensing system according to various aspects of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus, system, and method each including or otherwise related to an image sensor capable of generating three-dimensional shape images are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example and embodiment. Furthermore, the particular features, structures, or characteristics may be combined in any suitable manner in one or more examples and embodiments.

Throughout this specification, several terms of art are used. These terms are to take on their ordinary meaning in the art from which they come, unless specifically defined herein or the context of their use would clearly suggest otherwise.

Embodiments described herein utilize an image sensor with a pixel array that includes photodiodes configured to collect polarization information (polarization pixel cells) and photodiodes configured to collect depth information (time-of-flight pixel cells), in order to generate three-dimensional shape and depth images. In some embodiments, the photodiodes configured to collect polarization information are aligned with a polarization grid in order to generate information that can be used to determine a set of ambiguous surface normals. In some embodiments, the photodiodes configured to collect depth information may include time-of-flight pixel cells and their pixel supporting circuitry as described below. In some embodiments, the depth information may be used to solve the ambiguities in the ambiguous surface normals, thereby creating the three-dimensional shape image. Combining time-of-flight pixel cells and polarization pixel cells in a single image sensor provides multiple technical benefits, including but not limited to the elimination of registration errors between depth information and polarization information captured by separate image sensors, and the simplification of a device that includes the single combined image sensor instead of a separate depth sensor and polarization sensor.

FIG. 1 is a block diagram that shows a non-limiting example embodiment of a three-dimensional shape sensing system 100 according to various aspects of the present disclosure. As shown, three-dimensional shape sensing system 100 includes a light source 102 that emits light pulses, which are illustrated as emitted light 104 in FIG. 1. In the illustrated example, light source 102 is an adjustable frequency light source such that the pulses of emitted light 104 may be emitted at different frequencies. As shown, emitted light 104 is directed to an object 106. In one example, emitted light 104 includes pulses of infrared (IR) light. It is appreciated that in other examples, emitted light 104 may have wavelengths other than infrared, such as for example visible light, near-infrared light, etc., in accordance with the teachings of the present invention. Emitted light 104 is then reflected back from object 106, which is shown as back reflected light 108 in FIG. 1. As shown, reflected light 108 is directed from object 106 through objective lens 110 and is then focused onto a pixel array 112. In one example, the pixel array 112 includes a plurality of time-of-flight pixel cells and a plurality of polarization pixel cells arranged in a two-dimensional array. As will be discussed, in some embodiments, a sync signal 114 is generated by control circuitry 116 coupled to pixel array 112, which synchronizes the pulses of emitted light 104 with corresponding signals that control the plurality of time-of-flight pixel cells in pixel array 112, which sense the reflected light 108, in accordance with the teachings of the present disclosure.

In the example depicted in FIG. 1, it is noted that the pixel array 112 is positioned at a focal length $f_{lens}$ from objective lens 110. As shown in the example, the light source 102 and the objective lens 110 are positioned a distance L from the object 106. It is appreciated of course the FIG. 1 is not illustrated to scale and that in some examples, the focal length $f_{lens}$ is substantially less than the distance L between objective lens 110 and object 106. Therefore, it is appreciated that for the purposes of this disclosure, the distance L and the distance L+focal length $f_{lens}$ are substantially equal for purposes of time of flight measurements in accordance with the teachings of the present disclosure. In addition, it is also appreciated that for the purposes of this disclosure, the distance between the light source 102 and the object 106, and the distance between the object 106 and the objective lens 110, and are also both substantially equal to L for purposes of time of flight measurements in accordance with the teachings of the present disclosure. Accordingly, the distance between the light source 102 and the object 106 (and/or the distance between the object 106 and the objective lens 110) is equal to half of the round trip distance, e.g., D, which is therefore equal to 2×L. In other words, it is assumed that the distance L from light source 102 to the object 106, plus the distance L back from the object 106 to the objective lens 110, is equal to the round trip distance D (or 2×L) in accordance with the teachings of the present disclosure.

In the depicted example, there is a delay time of TOF between the emission of a light pulse of emitted light 104 and the receipt of that light pulse in reflected light 108, which is caused by the amount of time that it takes for the light pulse to travel the distance L from light source 102 to object 106, and then the additional time it takes for the corresponding pulse of reflected light 108 to travel the distance L back from object 106 to pixel array 112. The time difference TOF between emitted light 104 and reflected light 108 represents the time of flight for the light pulses to make the round trip between the light source 102 and object 106. Once the time of flight TOF is known, the distance L from light source 102 to object 106 can be determined using the following relationships in Equations 1 and 2 below:

$$TOF = \frac{2 \times L}{c} \quad (1)$$

$$L = \frac{T_{TOF} \times c}{2} \quad (2)$$

where c is the speed of light, which is approximately equal to $3 \times 10^8$ m/s, and TOF is the amount of time that it takes for the light pulse to travel to and from the object as shown in FIG. 1.

Figure 2:
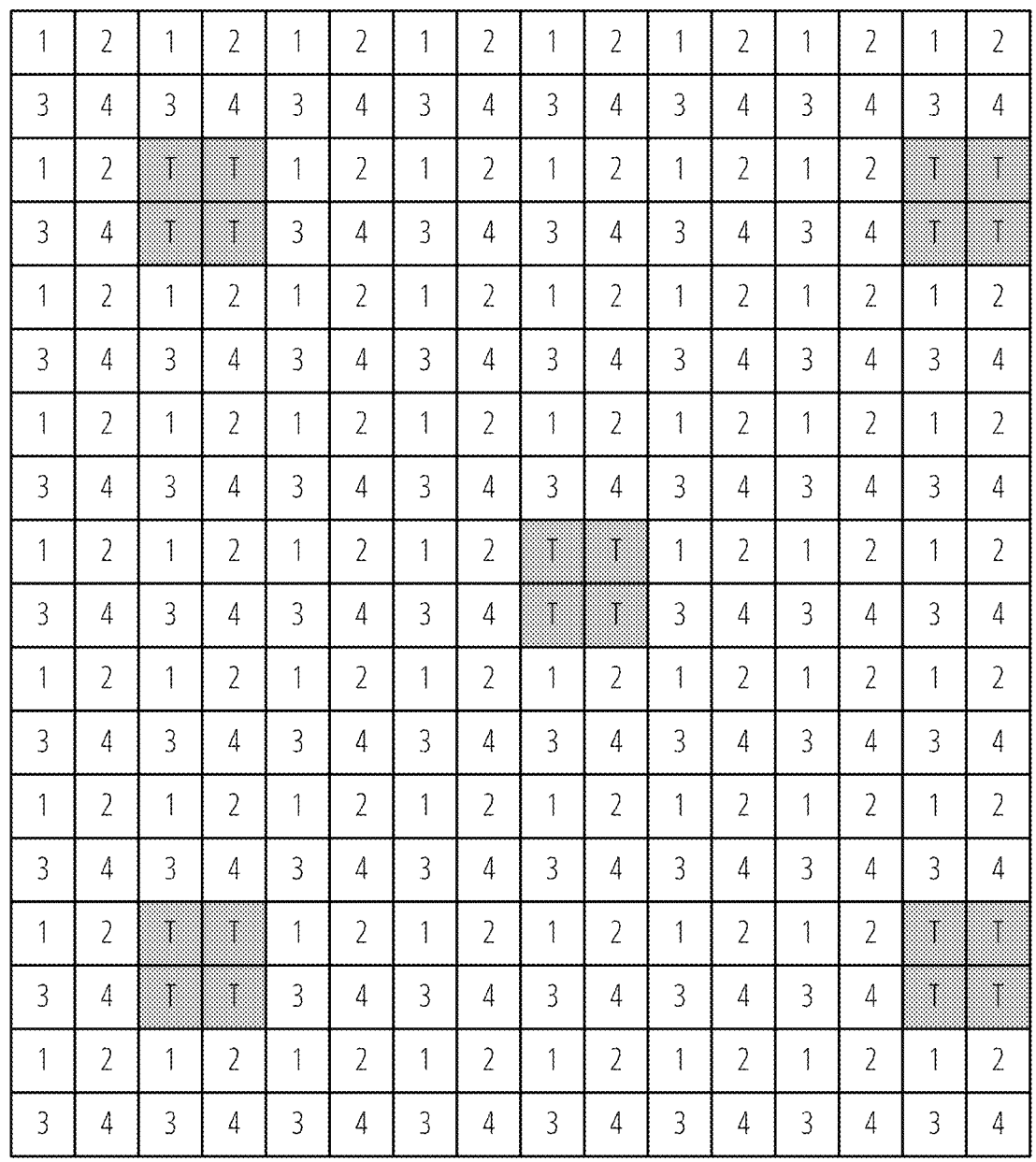
FIG. 2 is a schematic drawing that illustrates a non-limiting example embodiment of a pixel array pattern according to various aspects of the present disclosure.

FIG. 2 is a schematic drawing that illustrates a non-limiting example embodiment of a pixel array pattern according to various aspects of the present disclosure. The pixel array pattern 200 illustrates one potential layout for polarization pixel cells and time-of-flight pixel cells in a pixel array 112. In some embodiments, the pixel array pattern 200 may only show a portion of the pixel array 112, and the pattern shown in the pixel array pattern 200 may repeat in other portions of the pixel array 112, or other patterns may be used in other portions of the pixel array 112.

As shown, the pixel array pattern 200 includes polarization pixel cells in each of four polarization directions, with each direction being indicated by a number ("1," "2," "3," "4"). In some embodiments, the four polarization directions may be zero degrees, forty-five degrees, ninety degrees, and one-hundred thirty-five degrees. In other embodiments, four other polarization directions may be used. In some embodiments, only three polarization directions are used. As shown, the pixel array pattern 200 also includes time-of-flight pixel cells, indicated with a "T" and with shading that is added to clarify the illustration.

In the pixel array pattern 200, the polarization pixel cells are arranged in groups of two-by-two square groups of four, such that each group of four polarization pixel cells includes one polarization pixel cell in each orientation. The time-of-flight pixel cells are also arranged in groups of four. As shown, the groups of four time-of-flight pixel cells are arranged in a quincunx pattern throughout the pixel array pattern 200. In some embodiments, signals or information generated from each group of four polarization pixel cells and/or time-of-flight pixel cells may be processed together as a pixel. In some embodiments, signals or information generated from a larger group of pixel cells, such as a six-by-six group of pixel cells that is either all polarization pixel cells or a perimeter of polarization pixel cells surrounding a two-by-two square of time-of-flight pixel cells may be processed together as a pixel.

Figure 3:
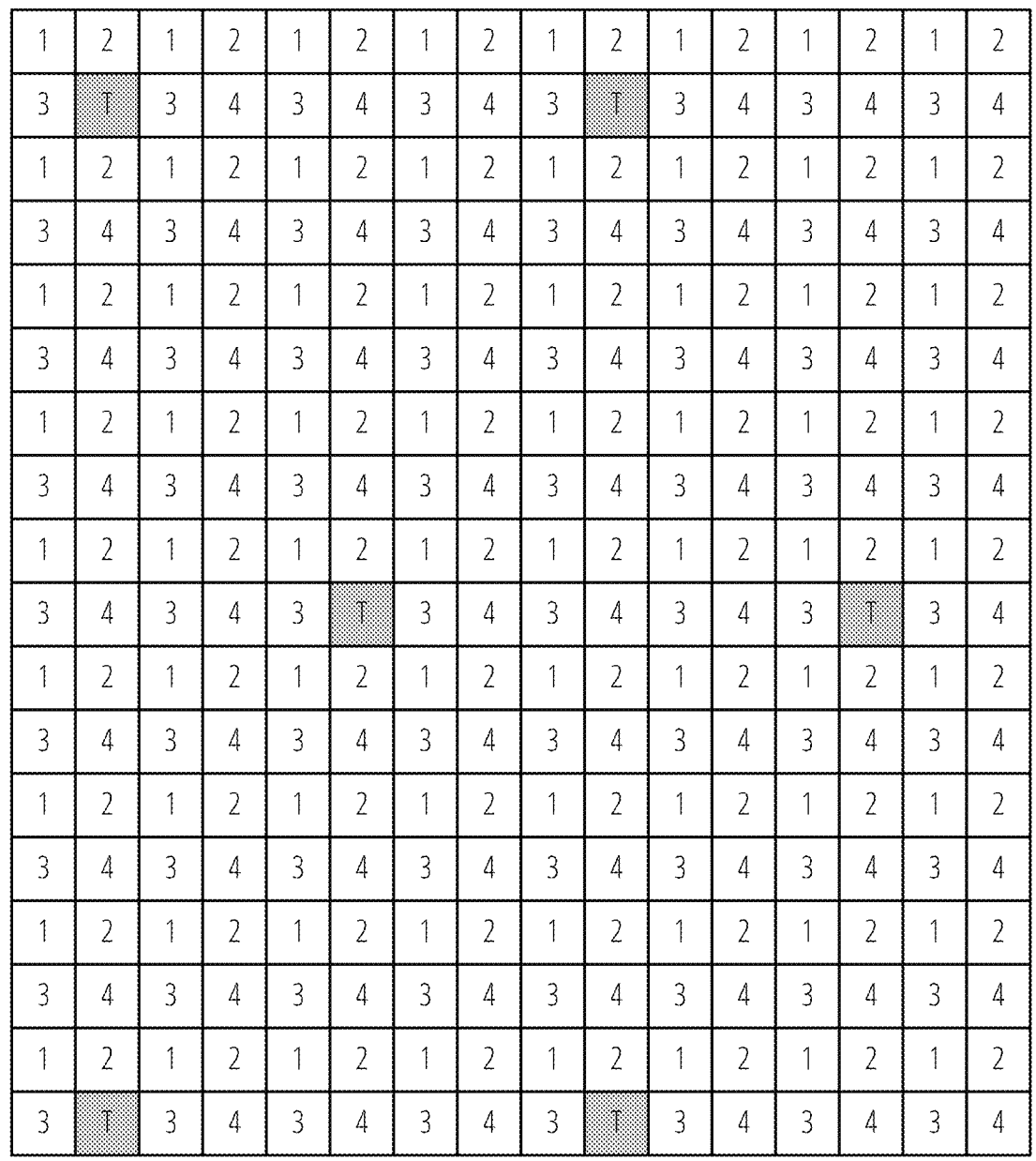
FIG. 3 is a schematic drawing that illustrates another non-limiting example embodiment of a pixel array pattern according to various aspects of the present disclosure.

FIG. 3 is a schematic drawing that illustrates another non-limiting example embodiment of a pixel array pattern according to various aspects of the present disclosure. The pixel array pattern 300 illustrates another potential layout for polarization pixel cells and time-of-flight pixel cells in a pixel array 112. As with FIG. 2, the pixel array pattern 300 may only show a portion of the pixel array 112, and the pattern shown in the pixel array pattern 300 may repeat in other portions of the pixel array 112, or other patterns may be used in other portions of the pixel array 112.

As shown, the pixel array pattern 300 includes polarization pixel cells in each of four polarization directions, with each direction being indicated by a number ("1," "2," "3," "4"). In some embodiments, the four polarization directions may be zero degrees, forty-five degrees, ninety degrees, and one-hundred thirty-five degrees. In other embodiments, four other polarization directions may be used. In some embodiments, only three polarization directions are used. As shown, the pixel array pattern 300 also includes time-of-flight pixel cells, indicated with a "T" and with shading that is added to clarify the illustration.

In the pixel array pattern 300, the polarization pixel cells are again arranged in groups of two-by-two square groups of four, such that each group of four polarization pixel cells includes one polarization pixel cell in each orientation. The time-of-flight pixel cells are arranged individually, and are sparsely distributed throughout the pixel array pattern 300. Each time-of-flight pixel cell replaces one polarization pixel cell in a group of polarization pixel cells. As shown, the single time-of-flight pixel cells are arranged in a quincunx pattern throughout the pixel array pattern 300. In some embodiments, signals or information generated from each group of four (or three) polarization pixel cells may be processed together as a pixel, and the single time-of-flight pixel cells may each be processed as a separate pixel. In some embodiments, signals or information generated from a larger group of pixel cells, such as a larger group of pixel cells that includes a plurality of polarization pixel cells and at least one time-of-flight pixel cell may be processed together as a pixel.

Figure 4:
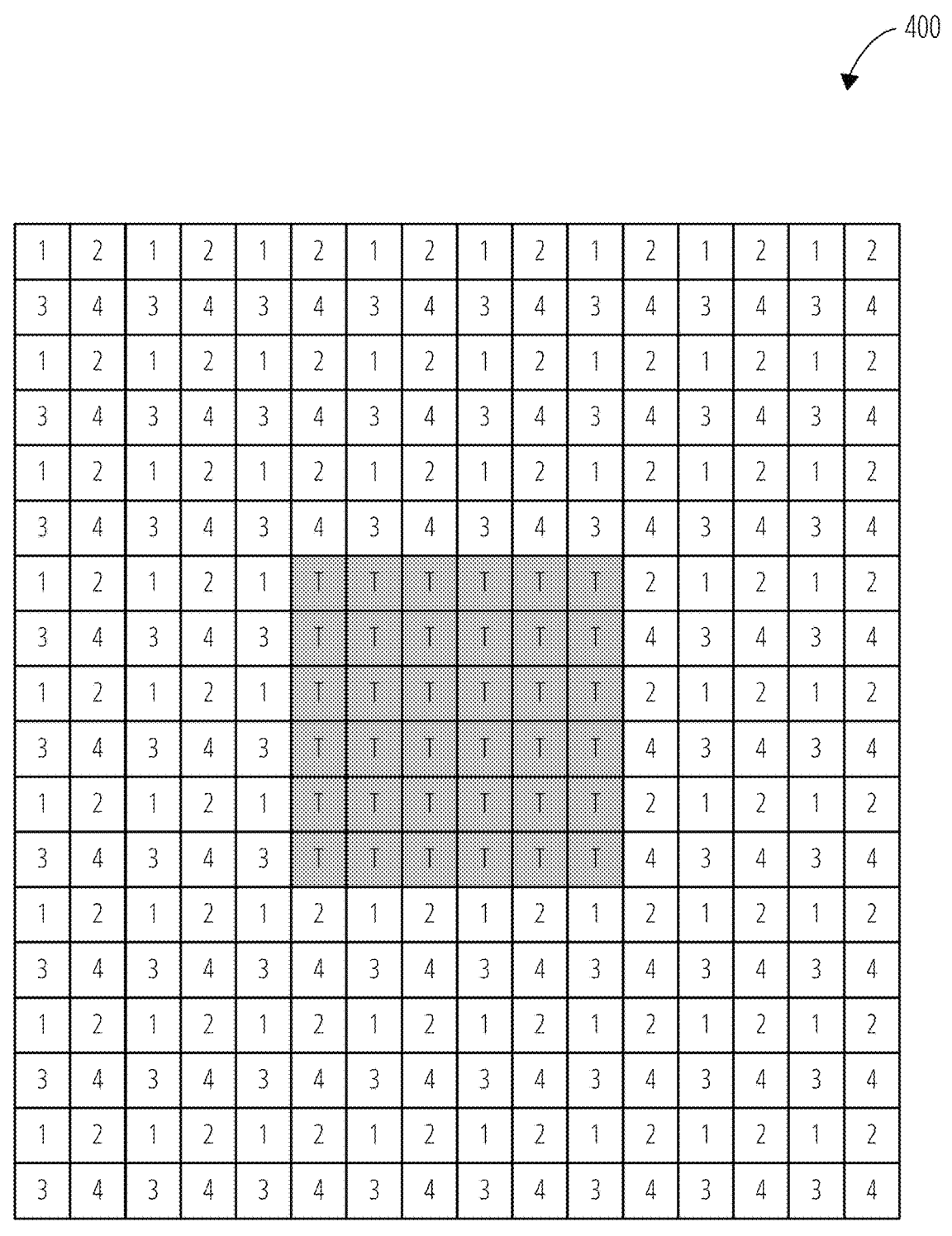

FIG. 4 is a schematic drawing that illustrates yet another non-limiting example embodiment of a pixel array pattern according to various aspects of the present disclosure. The pixel array pattern 400 illustrates another potential layout for polarization pixel cells and time-of-flight pixel cells in a pixel array 112. As with FIG. 2, the pixel array pattern 400 may only show a portion of the pixel array 112, and the pattern shown in the pixel array pattern 400 may repeat in other portions of the pixel array 112, or other patterns may be used in other portions of the pixel array 112.

As shown, the pixel array pattern 400 includes polarization pixel cells in each of four polarization directions, with each direction being indicated by a number ("1," "2," "3," "4"). In some embodiments, the four polarization directions may be zero degrees, forty-five degrees, ninety degrees, and one-hundred thirty-five degrees. In other embodiments, four other polarization directions may be used. In some embodiments, only three polarization directions are used. As shown, the pixel array pattern 400 also includes time-of-flight pixel cells, indicated with a "T" and with shading that is added to clarify the illustration.

In the pixel array pattern 400, the polarization pixel cells are again arranged in groups of two-by-two square groups of four, such that each group of four polarization pixel cells includes one polarization pixel cell in each orientation. Instead of being distributed throughout the pixel array pattern 400, the time-of-flight pixel cells are arranged in a single group in the center of the pixel array pattern 400. In some embodiments, signals or information generated from each group of four polarization pixel cells may be processed together as a pixel, and each single time-of-flight pixel cell may also be processed as a separate pixel. In some embodiments, signals or information generated from a larger group of pixel cells, such as a larger group of polarization pixel cells, may be processed together as a pixel.

Figure 5:
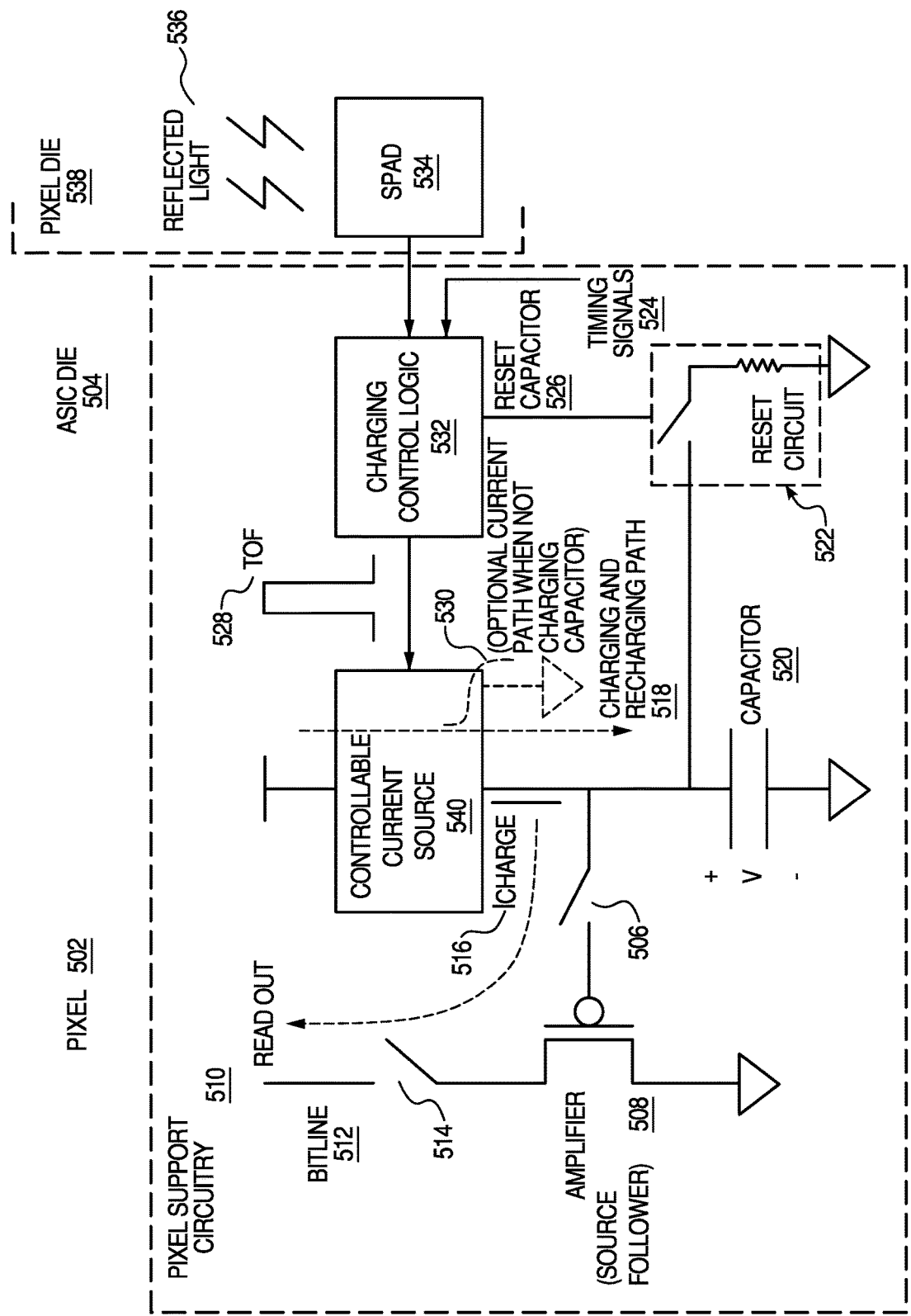
FIG. 5 is a schematic illustrating a non-limiting example embodiment of a time-of-flight pixel cell in accordance with various aspects of the present disclosure.

FIG. 5 is a schematic illustrating a non-limiting example embodiment of a time-of-flight pixel cell 502 in accordance with various aspects of the present disclosure. It is appreciated that time-of-flight pixel cell 502 may be one example of one of the plurality of time-of-flight pixel cells included for example in pixel array 112 of FIG. 1, and that similarly named and numbered elements referenced below are therefore coupled and function similar to as described above. As shown in the depicted example, time-of-flight pixel cell 502 includes a photosensor 534 and pixel support circuitry 510. Pixel support circuitry 510 includes charging control logic 532, controllable current source 540, capacitor 520, reset circuit 522, output switch 506, row select switch 514 and amplifier 508. Photosensor 534 senses photons of reflected light 536, which are reflected from an object, such as for example object 106 of FIG. 1. In one example, photosensor 534 may include a single photon avalanche diode (SPAD).

In the example, time-of-flight pixel cell 502 also includes charging control logic 532 coupled to the photosensor 534 to detect when the photosensor 534 senses the photons of reflected light 536 that are reflected from the object 106. Charging control logic 532 is further coupled to receive timing signals 524, which in the example may be representative of when pulses of emitted light 104 are emitted from the light source 102 to the object 106, and therefore enable time-of-flight pixel cell 502 to be synchronized with light source 102 in accordance with the teachings of the present disclosure.

As shown in the depicted example, a controllable current source 540 is coupled to provide a charge current $I_{CHARGE}$ 516 in response to a time-of-flight signal 528 coupled to be received from the charging control logic 532. In the example, the time-of-flight signal 528 is generated by charging control logic 532, and is representative of the time of flight for the round trip travel of each one of the pulses of emitted light 104 from the light source 102 until the photosensor 534 senses a respective one of the photons of the reflected light 536 reflected from the object 106 in accordance with the teachings of the present disclosure.

In the example, an energy storage device illustrated for example as a capacitor 520 is coupled to receive the charge current $I_{CHARGE}$ 516 from the controllable current source 540 in response to the time-of-flight signal 528. In one example, the controllable current source 540 is coupled to provide the charge current $I_{CHARGE}$ 516 to the capacitor 520 after each pulse of emitted light 104 is emitted from the light source 102 until the photosensor 534 senses a respective one of the photons of reflected light 536 reflected from the object 106 in accordance with the teachings of the present invention. As a result, a voltage V accumulated on the capacitor 520 is representative of a round trip distance D to the object 106 in accordance with the teachings of the present invention. In one example, a reset circuit 522 is coupled to capacitor 520 to reset the accumulated voltage V on the capacitor 520 in response to a reset capacitor signal 526 after capacitor 520 is charged a plurality of n times by the controllable current source 540 in response to the time-of-flight signal 528 in accordance with the teachings of the present disclosure.

As shown in the example, time-of-flight pixel cell 502 also includes an amplifier 508 that is coupled to the capacitor 520 through an output switch 506 to read out the voltage V accumulated on the capacitor 520 after being charged the plurality of n times by the controllable current source 540 in response to the time-of-flight signal 528. In the example, the reset circuit 522 is coupled to reset the voltage V accumulated on the capacitor 520 after the voltage V on the capacitor 520 has been read out in accordance with the teachings of the present disclosure. In one example, the amplifier 508 is a source follower coupled transistor as shown, and the output switch 506 is coupled between the capacitor 520 and the gate of the transistor of amplifier 508. In one example, time-of-flight pixel cell 502 also includes a row select switch 514 coupled between an output of the amplifier 508 and a bitline 512, through which the output of time-of-flight pixel cell 502 may be read out in accordance with the teachings of the present invention.

As shown in the example depicted in FIG. 5, controllable current source 540 includes a charging and recharging path 518 through which charge current $I_{CHARGE}$ 516 is conducted to charge capacitor 520. In one example, charge current $I_{CHARGE}$ 516 through charging and recharging path 518 is switched current path such that no charge current $I_{CHARGE}$ 516 flows when capacitor 520 is not charged. In another example, controllable current source 540 includes an alternate optional current path 530 through which charge current $I_{CHARGE}$ 516 is conducted when capacitor 520 is not charged. For instance, in one example charge current $I_{CHARGE}$ 516 is diverted from charging and recharging path 518 to optional current path 530 when a photon is detected by photosensor 534 until a next pulse of emitted light 104 is emitted from light source 102 in accordance with the teachings of the present disclosure. It is appreciated that in an example in which optional current path 530 is included, charge current $I_{CHARGE}$ 516 consumption is constant in time-of-flight pixel cell 502 whether or not capacitor 520 is being charged in accordance with the teachings of the present disclosure.

As illustrated in the example depicted in FIG. 5, it is noted that time-of-flight pixel cell 502 may be implemented in a stacked chip scheme. For instance, as shown in the example, photosensor 534 may be included in a pixel die 538, while pixel support circuitry 510 of time-of-flight pixel cell 502 illustrated in FIG. 5 may be included in a separate application specific integrated circuit (ASIC) 504 in accordance with the teachings of the present disclosure. In the example, the pixel die 538 and ASIC die 504 are stacked and coupled together during fabrication to implement a time-of-flight sensing system in accordance with the teachings of the present disclosure.

Figure 6:
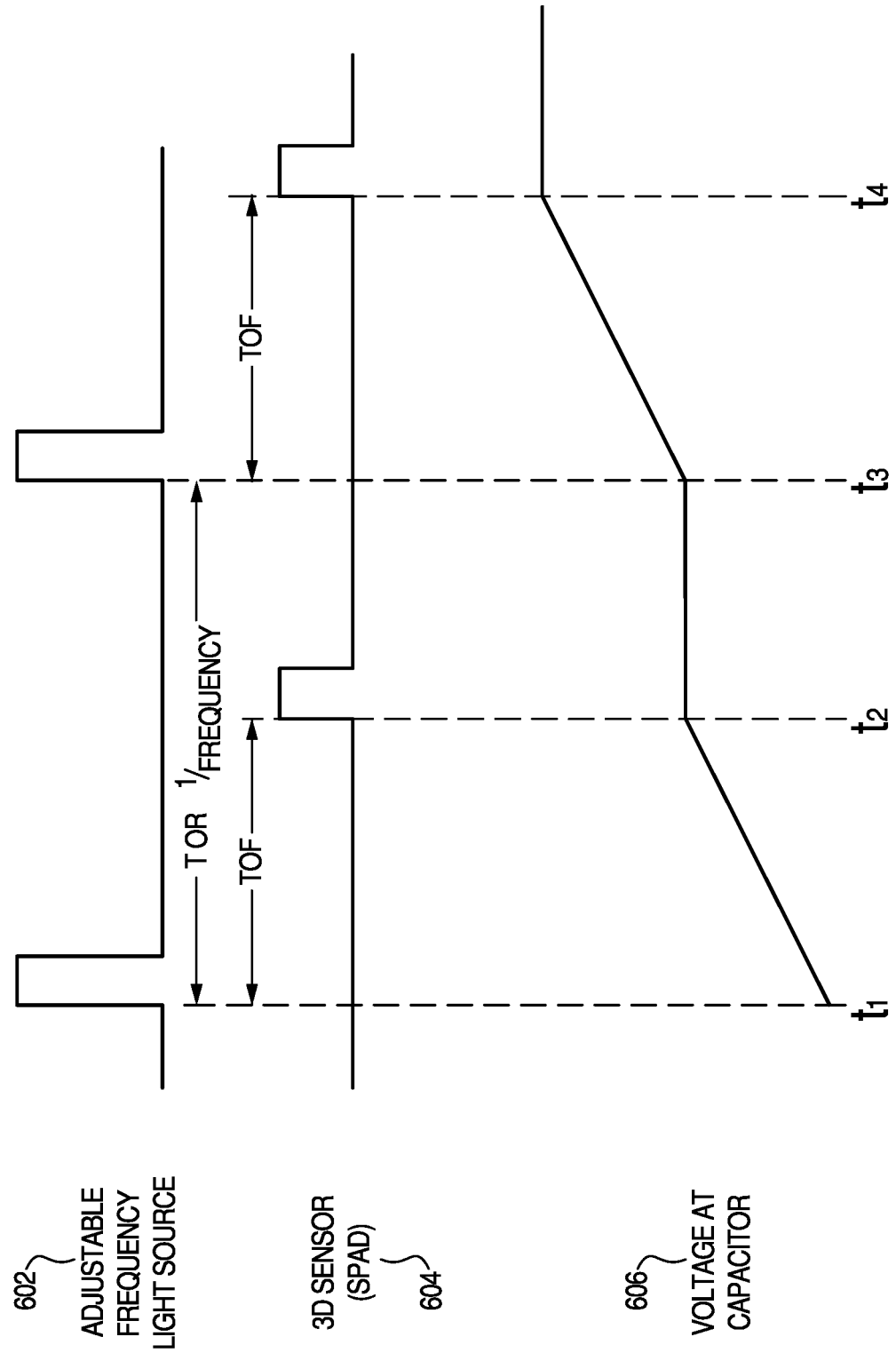
FIG. 6 is a timing diagram that shows a non-limiting example embodiment of emitted light pulses from an adjustable frequency light source, the respective reflected photons that are sensed by a 3D sensor, and the corresponding voltage accumulated on a capacitor in an example time-of-flight pixel cell according to various aspects of the present disclosure.

FIG. 6 is a timing diagram that shows a non-limiting example embodiment of emitted light pulses from an adjustable frequency light source 602, the respective reflected photons that are sensed by a 3D sensor 604, and the corresponding voltage accumulated on a capacitor 606 in an example time-of-flight pixel cell according to various aspects of the present disclosure. It is appreciated that adjustable frequency light source 602 may correspond for example with light source 102 of FIG. 1, that 3D sensor 604 may correspond for example with photosensor 534 of FIG. 5, that the corresponding voltage accumulated on a capacitor 606 may correspond for example with the voltage V accumulated in capacitor 520 of FIG. 5, and that similarly named and numbered elements referenced below are therefore coupled and function similar to as described above. As shown in the example, light pulses are emitted at time $t_1$ and at time $t_3$. In the example, the period between the emissions of light pulses at time $t_1$ and time $t_3$ is equal to T, which is also equal to 1/frequency that the light pulses are emitted from the light source 102. It is therefore appreciated of course that if the frequency of the emissions of the light pulses is increased, the period of time T between time $t_1$ and time $t_3$ is reduced.

The example depicted in FIG. 6 also illustrates that the 3D sensor 604 detects the photons that are reflected back from the object 106 at time $t_2$ and time $t_4$. Accordingly, the time of flight TOF for the pulses of emitted light 104 to travel the round trip distance D back and forth between light source 102 and photosensor 534 is equal to the time between time $t_1$ and $t_2$, and/or the time between $t_3$ and $t_4$ as illustrated in FIG. 6 in accordance with the teachings of the present disclosure.

The example in FIG. 6 also illustrates that the capacitor 520 is charged when a light pulse 104 is emitted from light source 102 until a reflected photon in back reflected light 536 is detected by photosensor 534 in accordance with the teachings of the present disclosure. After the reflected photon is detected by photosensor 534, the capacitor 520 is not charged until the next pulse of emitted light 104 is emitted from light source 102 in accordance with the teachings of the present disclosure. Accordingly, the voltage on capacitor 606 accumulates during the time of flight TOF of the light pulses between time $t_1$ and time $t_2$, and between time $t_3$ and time $t_4$, and there is no accumulation of additional voltage on capacitor 606 between time $t_2$ and time $t_3$, and after time $t_4$ in FIG. 6 as shown in accordance with the teachings of the present disclosure.

Figure 7:
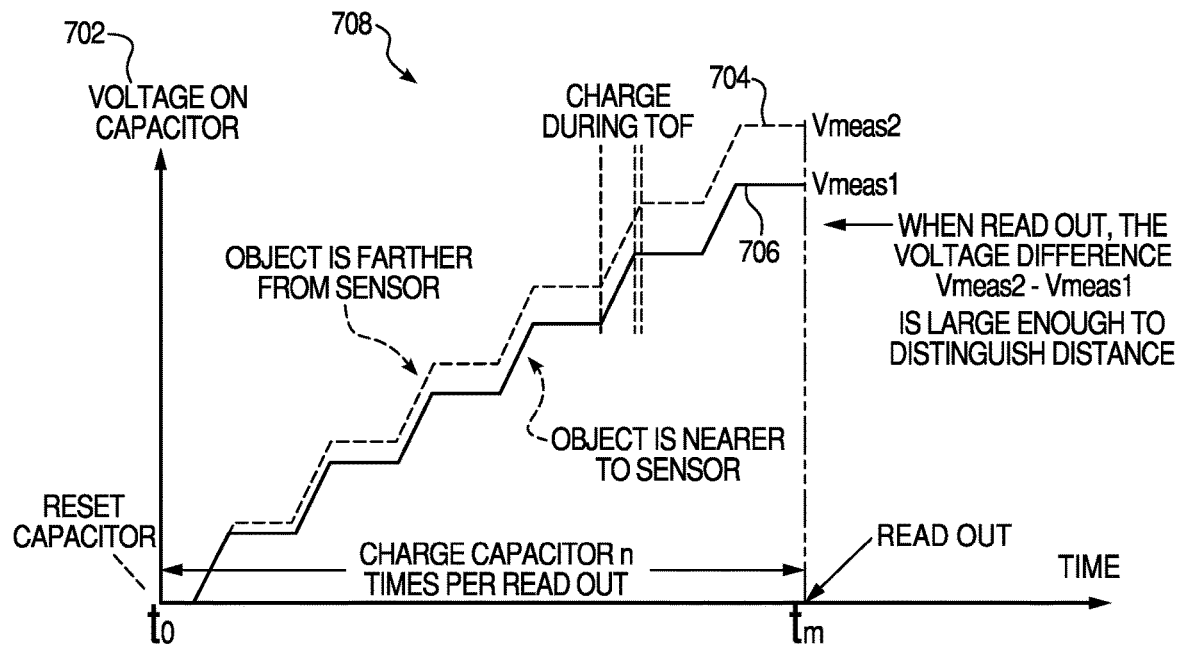
FIG. 7 illustrates two timing diagrams that show non-limiting examples of the voltage being accumulated, or oversampled, on a capacitor during the time of flight of each round trip of pulses of light that are emitted from a light source to and from objects according to various aspects of the present disclosure.
Figure 7:
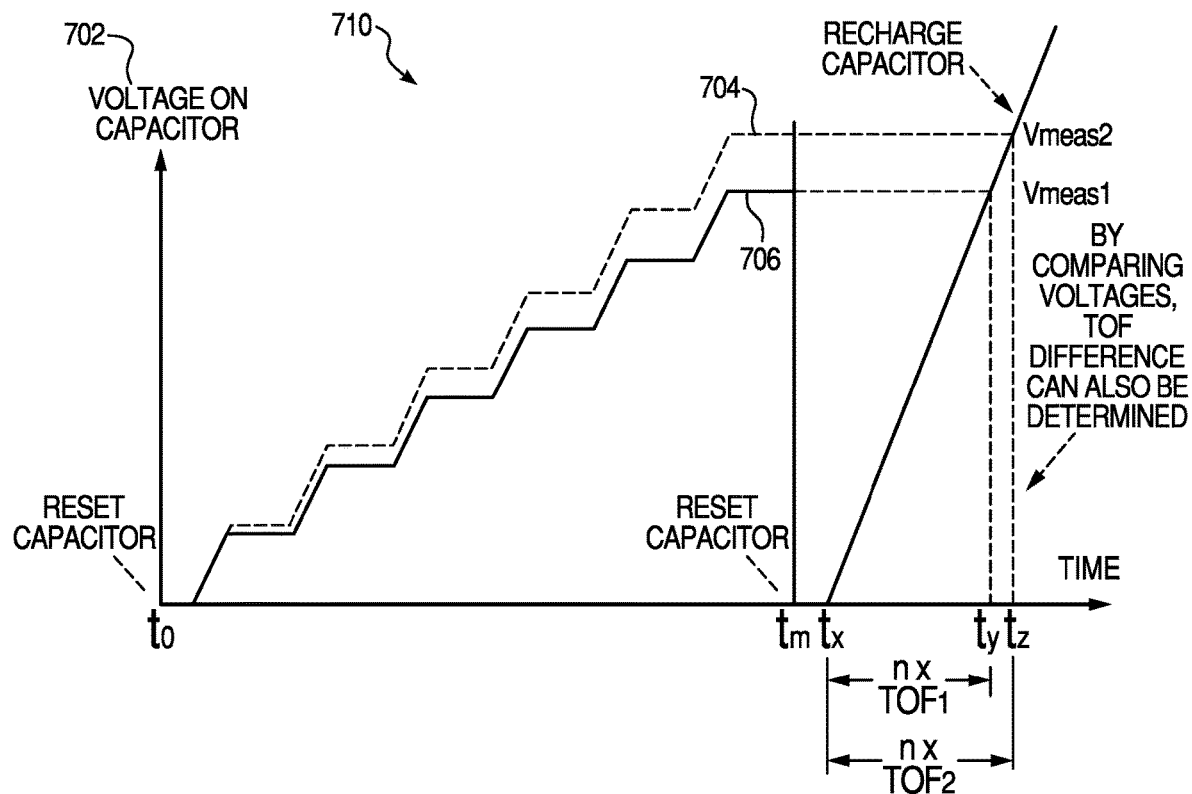

FIG. 7 illustrates two timing diagrams that show non-limiting examples of the voltage being accumulated, or oversampled, on a capacitor 520 during the time of flight of each round trip of pulses of light that are emitted from a light source to and from objects according to various aspects of the present disclosure. In a first chart 708, the capacitor is initially reset at time $t_0$ to a known voltage, such as for example zero volts. In the example, a plurality of n pulses of light 104 are emitted from light source 102 such that charge on capacitor 520 is accumulated n times for the duration of the time of flight of each one of the light pulses from light source 102 to object 106 and back to photosensor 534. After the capacitor 520 has been charged or oversampled the n times, the capacitor is then read out at time tm in accordance with the teachings of the present disclosure.

In the example shown in the first chart 708, the graphs for two different time of flight measurements are shown for comparison. In particular, graph 706 shows an example of the voltage on capacitor 702 for n charges for an object that is closer to the photosensor 534, and graph 704 shows an example of the voltage on capacitor 702 for n charges for an object that is farther from the photosensor 534. As shown in the example, since the voltage on capacitor 702 is accumulated for n charges, the voltage on capacitor 702 is large enough to read out by the time of flight sensing system with a sufficient signal-to-noise ratio. For instance, in the depicted example, the measured voltage $V_{meas1}$ is read out for graph 706 after n charges, and the measured voltage $V_{meas2}$ is read for graph 704 after the n charges. In addition, the first chart 708 shows that when read out, the difference between the voltage measurements $V_{meas1}$ and $V_{meas2}$ for graph 706 and graph 704 are large enough to distinguish the round trip distance differences between the objects of graph 706 and graph 704 in accordance with the teachings of the present disclosure.

In one example, after the time of flight measurements are read out after the n charges on the capacitor as shown, the measurements may then be scaled to account for the oversampling. For instance, in one example, assuming that a voltage measurement of $V_{meas}$ from the capacitor is read out after the n charges, the measurement $V_{meas}$ may then be scaled by the number of charges, n, to generate an average value for $V_{avg}$ for each time of flight measurement:

$$V_{avg} = \frac{V_{meas}}{n} \quad (3)$$

where $V_{avg}$ is the average measurement, $V_{meas}$ is the measurement read out from the capacitor after the n charges, and n is the number of times the capacitor was charged for that read out.

The second chart 710 is another timing diagram that shows the example of the voltages being accumulated shown in the first chart 708, with voltage on capacitor 702 then being reset and then recharged to determine the time of flight measurements for graph 706 and graph 704 in accordance with the teachings of the present disclosure. In particular, the capacitor is initially reset at time $t_0$ to a known voltage, such as for example zero volts. In the example, the voltage on capacitor 702 is accumulated n times for the n time of flight measurements for graph 706 and graph 704. After the capacitor has been charged the n times, the capacitor is then read out at time $t_m$, as discussed above.

The example depicted in the second chart 710 also shows that after the capacitor is then reset at time tm, the capacitor is then recharged back to the measured voltages $V_{meas1}$ and $V_{meas2}$, which may performed to help determine time of flight information in accordance with the teachings of the present disclosure. For instance, as shown in the depicted example, the capacitor is recharged starting at time $t_x$ to ty to reach $V_{meas1}$, and may be charged further to reach $V_{meas2}$ at time $t_z$ as shown. Assuming that the capacitor was charged n times, the average time of flight for each charge in graph 706 can be determined according to the following relationship $$t_y - t_x = n \times \text{TOF}_1 \quad (4)$$

where $\text{TOF}_1$ is the average time of flight associated with each charge in graph 706 and n is the number of charges per read out. Similarly, the average time of flight for each charge in graph 704 can be determined according to the following relationship $$t_z - t_x = n \times \text{TOF}_2 \quad (5)$$

where $\text{TOF}_2$ is the average time of flight associated with each charge in graph 704 and n is the number of charges per read out. It is appreciated that by comparing the measurements, the difference $t_z - t_y$ in the time of flights in graph 706 and graph 704 can also be determined in accordance with the teachings of the present disclosure.

Figure 8:
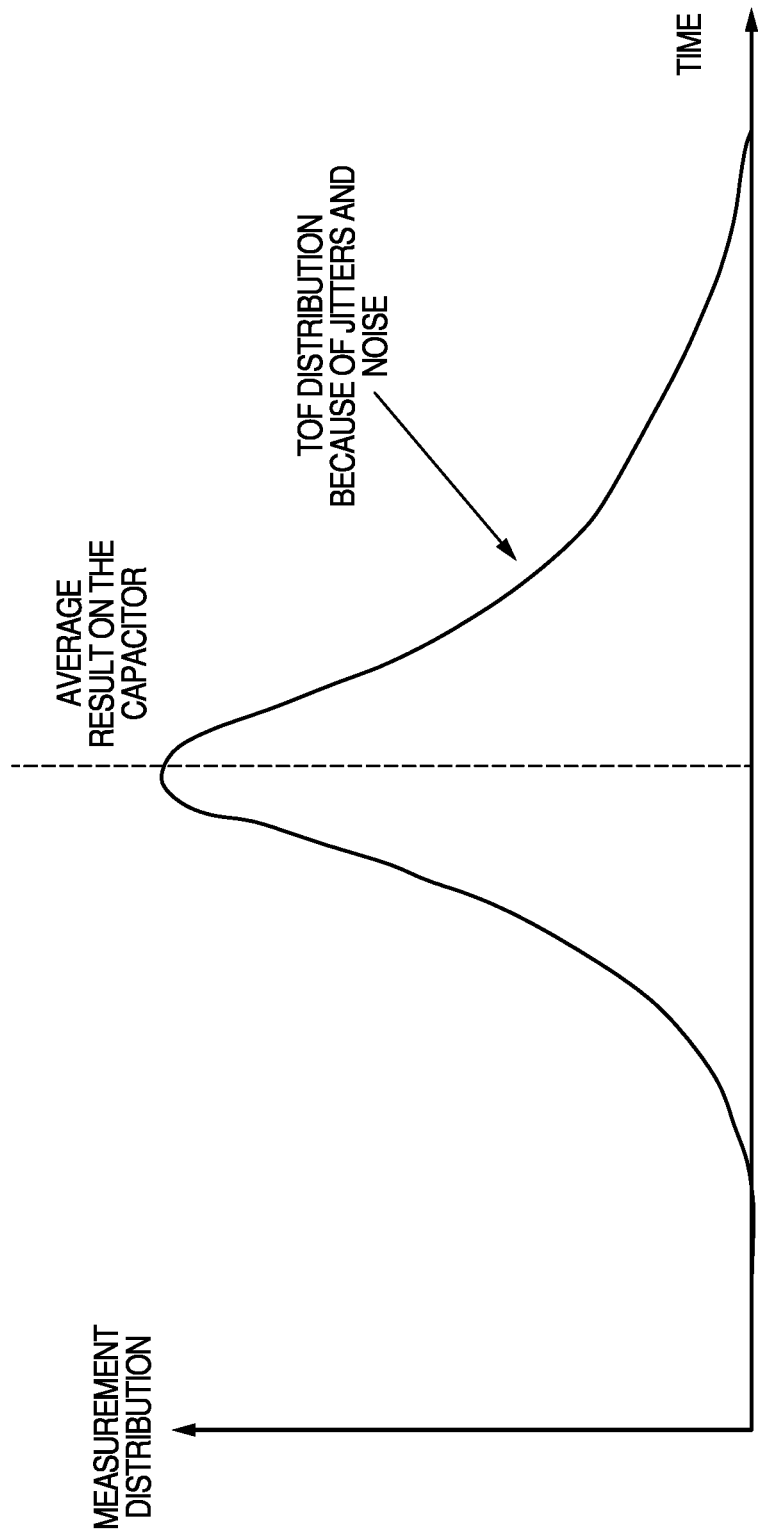
FIG. 8 is diagram that shows a distribution of time-of-flight measurements of emitted light pulses to and from an object using an example time-of-flight sensing system in accordance with various aspects of the present disclosure.

FIG. 8 is diagram that shows a distribution of time-of-flight measurements of emitted light pulses to and from an object using an example time-of-flight sensing system in accordance with various aspects of the present disclosure. In particular, since there is random noise and jitter in a time-of-flight sensing system, multiple time of flight measurement results will have a distribution as shown in FIG. 8. With multiple time of flight measurements, the capacitor averages all of the measured results, and the peak in the distribution is therefore determined to be the averaged result, which accounts for the noise, jitter, or clock in the time of flight sensing system in accordance with the teachings of the present disclosure.

Referring briefly back to FIG. 5, it is noted that in an ideal situation, all of the photons that are reflected back in reflected light 536 from an object 106 would be detected by the photosensor 534. Accordingly, the charging control logic 532 would therefore control the controllable current source 540 not to charge the capacitor 520 with charge current charge current $I_{CHARGE}$ 516 once each reflected back photon in reflected light 536 is detected. However, more realistically, only some of the reflected back photons in reflected light 536 may be detected by photosensor 534. As a consequence, the remaining reflected back photons in reflected light 536 go undetected, which therefore causes in the charge current charge current $I_{CHARGE}$ 516 to erroneously continue charging the capacitor 520 until a maximum time is ultimately reached for that cycle. The maximum time is based on the period or frequency of the emitted light 104.

To illustrate, referring briefly back to FIG. 6, a photon that is reflected back should be detected by the photosensor 534, as shown with 3D sensor 604, which would turn off the charging of the capacitor, which is shown for example at time $t_2$ or at time $t_4$. However, if a photon that is reflected back in reflected light 536 is not detected by the photosensor 534, then the charge current $I_{CHARGE}$ 516 continues to charge the capacitor 520 until nearly the next cycle of the adjustable frequency light source 602, at which time a next pulse of emitted light 104 is emitted from light source 102. In other words, if a photon that is reflected back in reflected light 536 is not detected by the photosensor 534, the capacitor 520 is mistakenly charged for the maximum time for that cycle of the adjustable frequency light source 602. That maximum charge time translates to the maximum range for that particular frequency or period T of the adjustable frequency light source 602.

Figure 9:
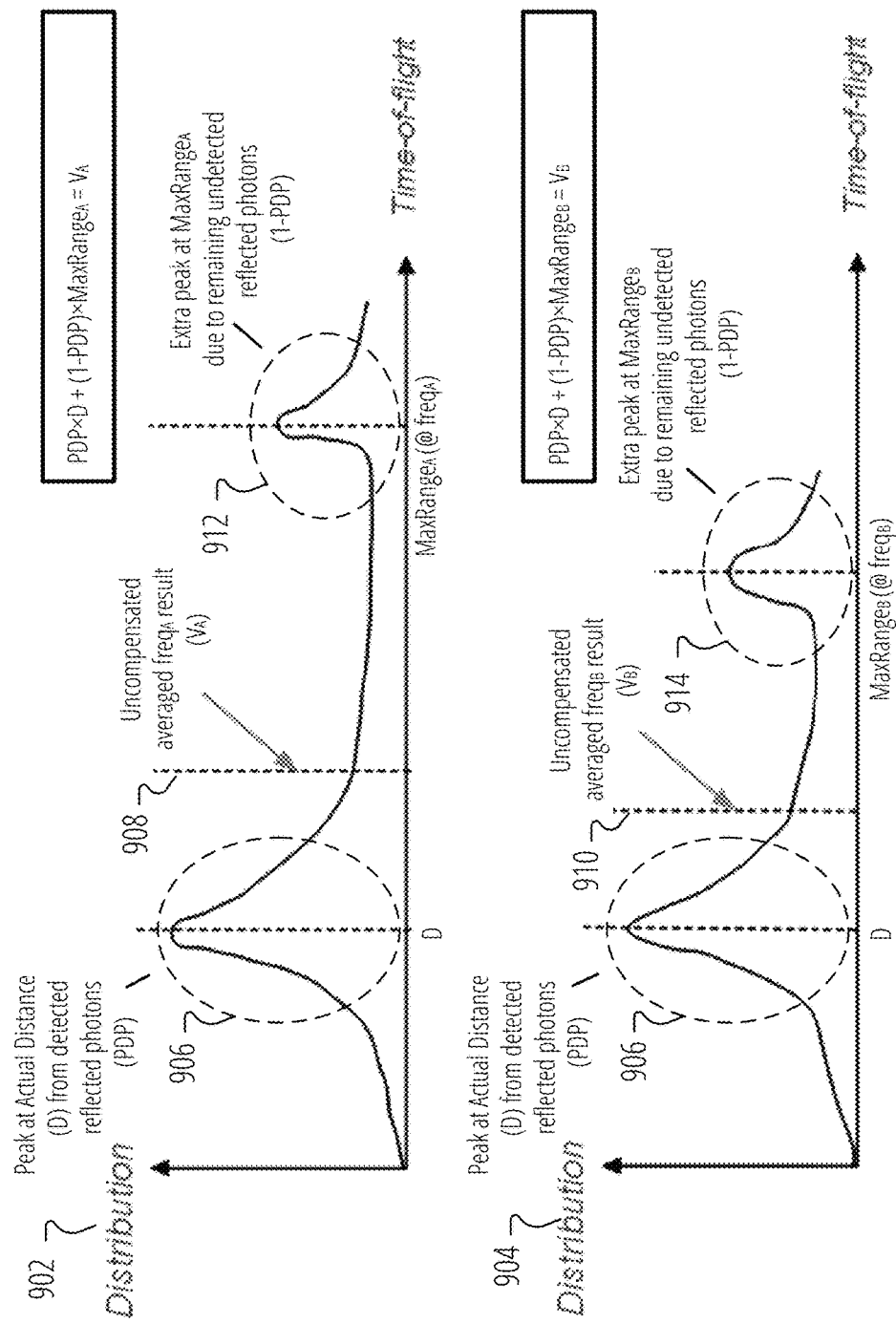
FIG. 9 illustrates diagrams that show non-limiting example embodiments of distributions of time-of-flight measurements of light pulses that are emitted at first and second frequencies in an example time of flight sensing system to compensate for the undetected reflected back photons in accordance with various aspects of the present disclosure.

FIG. 9 illustrates diagrams that show non-limiting example embodiments of distributions of time-of-flight measurements of light pulses that are emitted at first and second frequencies in an example time of flight sensing system to compensate for the undetected reflected back photons in accordance with various aspects of the present disclosure. In particular, top distribution graph 902 of FIG. 9 illustrates an example measurement distribution of a time of flight measurement taken with the adjustable frequency light source 102 set to a frequency equal to freqa. As shown in the example, there are two peaks in distribution graph 902. The example peak 906 on the left hand side of the distribution graph 902 corresponds to the actual round trip distance D to the object 106 as indicated by the fraction of the reflected back photons that were actually detected by the photosensor 534. However, the example peak 912 on the right hand side of the distribution graph 902 corresponds to the maximum range MaxRange$_A$ at a frequency of freq$_a$, resulting from the remaining fraction of the reflected back photons that were undetected by the photosensor 534. In the example, the extra unwanted peak 912 at MaxRange$_A$ distorts the time of flight measurement distribution graph 902, causing the overall uncompensated averaged result for distribution graph 902 to be at V$_A$ 910, which as shown in FIG. 9 is shifted over to the right in distribution graph 902 from the actual round trip distance D.

Assuming that percentage of reflected back photons that are detected by photosensor 534 can expressed with a photon detection probability (PDP), the peak 906 at the actual round trip distance D may be represented with the term:

$$\text{PDP} \times D. \tag{6}$$

Correspondingly, the remaining percentage of reflected back photons that are undetected by photosensor 534 is equal to (1−PDP), and the peak 912 at the MaxRange$_A$ for frequency freq$_a$ may therefore be represented with the term:

$$(1-\text{PDP}) \times \text{MaxRange}_A. \tag{7}$$

Finally, as discussed above, the overall uncompensated averaged result for distribution graph 902 is measured to be V$_A$ 908, which is determined with only the fraction PDP of the photons being detected and the frequency of the adjustable light source being equal to freq$_a$. Thus, the top distribution graph 902 of FIG. 9 can be represented by:

$$\text{PDP} \times D + (1-\text{PDP}) \times \text{MaxRange}_A = V_A. \tag{8}$$

In order to determine the actual round trip distance D without knowing the actual percentage of photons that were actually detected by the photosensor 534, it can be assumed that the maximum range can be determined based on the frequency of the light source, and that the overall uncompensated averaged result V$_A$ 908 can be measured.

With these assumptions in mind, FIG. 9 shows another non-limiting example measurement distribution of a time of flight measurement distribution graph 904 taken with the light source 102 set to a different frequency equal to freq$_b$ in accordance with the teachings of the present disclosure. As shown in the example, there are also two peaks in distribution graph 904, including the same example peak 906 on the left hand side of the distribution graph 904, which corresponds to the actual round trip distance D to the object 106 as indicated by the fraction of the reflected back photons that were actually detected by the photosensor 534.

However, the example peak 914 on the right hand side of the distribution graph 904 corresponds to the maximum range MaxRange$_B$ at the frequency of freq$_b$, resulting from the remaining fraction of the reflected back photons that were undetected by the photosensor 534. In the example, the extra unwanted peak 914 at MaxRange$_B$ also distorts the time of flight measurement distribution causing the overall uncompensated averaged result for distribution graph 904 to be at V$_B$ 910, which as shown in FIG. 9 is shifted over to the right in distribution graph 904 from the actual round trip distance D.

In the depicted example, it is assumed that frequency freq$_b$ that is illustrated in the bottom distribution graph 904 of FIG. 9 is greater than the frequency freq$_a$ illustrated in the top distribution graph 902 of FIG. 9. Accordingly, the period of time T for each cycle of the light pulses in bottom distribution graph 904 of FIG. 9 is shorter than the period of time T for each cycle of the light pulses in to distribution graph 902 of FIG. 9, which results in MaxRange$_B$ being less than the MaxRange$_A$, as shown in FIG. 9. It is also appreciated that the bottom distribution graph 904 of FIG. 9 can be represented according to:

$$\text{PDP} \times D + (1-\text{PDP}) \times \text{MaxRange}_B = V_B. \tag{9}$$

With Equation 8 and Equation 9 above, it is appreciated that there are two equations with only two unknown variables, D and PDP. The other terms V$_A$, V$_B$, MaxRange$_A$, and MaxRange$_B$ are all known because V$_A$ and V$_B$ are measured, and MaxRange$_A$ and MaxRange$_B$ can be determined from the respective frequencies freq$_a$ and freq$_b$. In addition, although PDP is an unknown variable, it can be assumed that PDP at least does not change between the measurements of V$_A$ and V$_B$ using the two different frequencies, e.g., freq$_a$ and freq$_b$, in accordance with the teachings of the present disclosure.

Continuing with Equation 9 above, PDP can be isolated on the left hand side of the equation as follows:

$$PDP \times D + MaxRange_B - PDP \times MaxRange_B = V_B, \tag{10}$$

$$PDP \times D - PDP \times MaxRange_B = V_B - MaxRange_B, \tag{11}$$

$$PDP \times (D - MaxRange_B) = V_B - MaxRange_B, \tag{12}$$

$$PDP = \frac{(V_B - MaxRange_B)}{(D - MaxRange_B)}. \tag{13}$$

Next, PDP can be substituted with Equation 13 back into Equation 8 above:

$$\frac{(V_B - MaxRange_B)}{(D - MaxRange_B)} \times D + \left(1 - \frac{(V_B - MaxRange_B)}{(D - MaxRange_B)}\right) \times MaxRange_A = V_A. \tag{14}$$

Finally, D can be solved for in Equation 14 above to determine the actual round trip distance D in accordance with the teachings of the present disclosure. Therefore, the distortions in the measurement distributions caused by the percentage (1−PDP) of reflected photons that are not detected can be compensated for in accordance with the teachings of the present disclosure.

Figure 10:
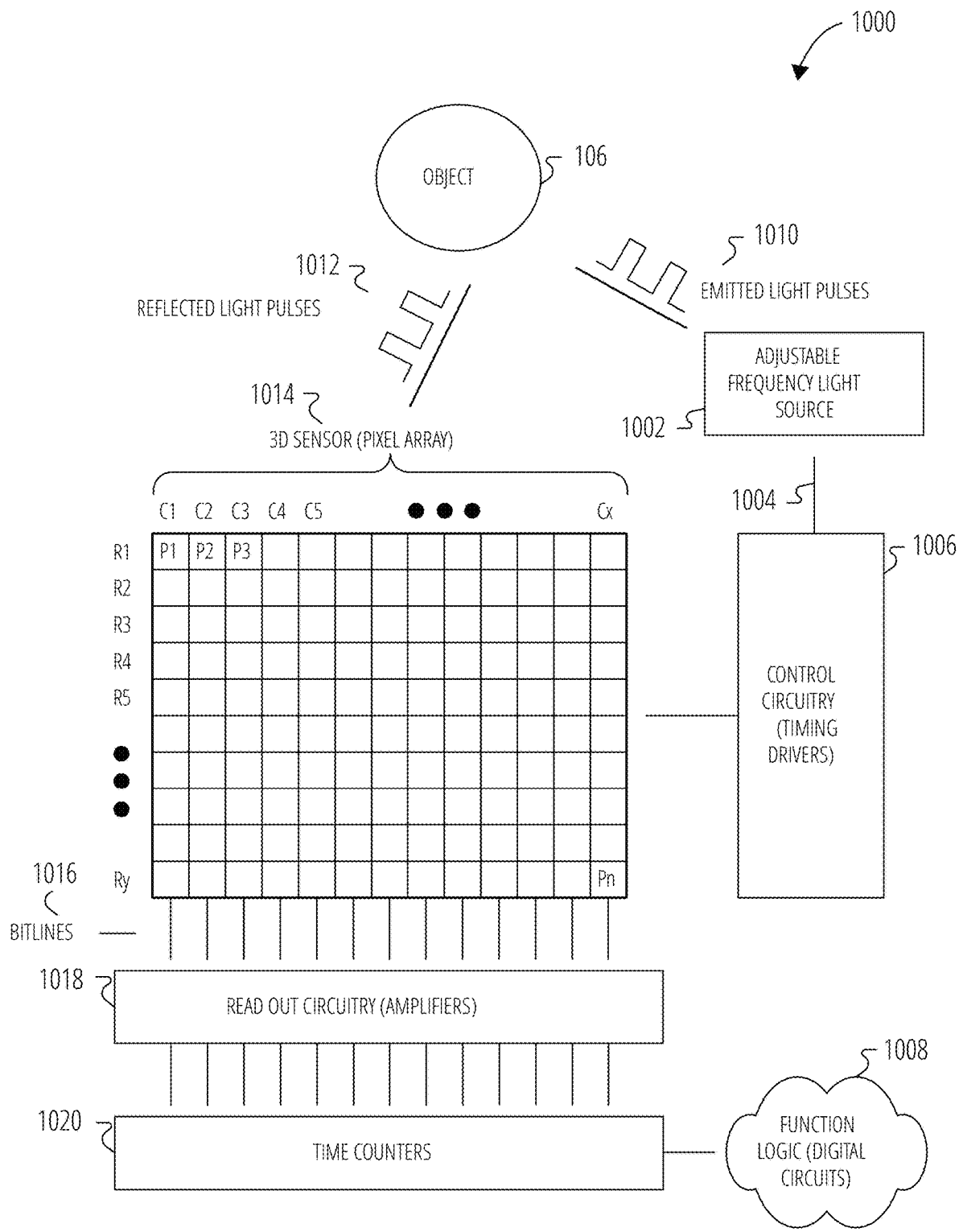
FIG. 10 illustrates a time-of-flight sensing system 1000 in accordance with one embodiment.

FIG. 10 is block diagram that shows a portion of a non-limiting example embodiment of a time-of-flight sensing system 1000 including a time-of-flight pixel array with corresponding readout circuitry, control circuitry and function logic according to various aspects of the present disclosure. As shown, the illustrated example of time-of-flight sensing system 1000 includes a pixel array 1014, read out circuitry 1018, time counters 1020, function logic 1008, control circuitry 1006, and an adjustable frequency light source 1002 to sense the round trip distance to object 106 in accordance with the teachings of the present disclosure.

In the example illustrated in FIG. 10, pixel array 1014 is a two dimensional (2D) array of time-of-flight pixel cells (e.g., time-of-flight pixel cells P1, P2 . . . , Pn). In one example, each of the time-of-flight pixel cells P1, P2, . . . , Pn may be substantially similar to one of the time-of-flight pixel cells discussed above in FIG. 5, and that similarly named and numbered elements referenced below are therefore coupled and function similar to as described above. As illustrated, each pixel is arranged into a row (e.g., rows R1 to Ry) and a column (e.g., column C1 to Cx) to acquire time of flight information of an image object 106 focused onto pixel array 1014. Thus, the time of flight information can then be used to determine the distance or depth information to the object 106 in accordance with the teachings of the present disclosure. In some embodiments, the pixel array 1014 is a subset of the pixel array 112 of the overall three-dimensional shape sensing system 100, and the time-of-flight pixel cells may be spaced apart by one or more polarization pixel cells (as illustrated in FIG. 2-FIG. 4).

In some embodiments, control circuitry 1006 is controls and synchronizes adjustable frequency light source 1002 with a sync signal 1004 to emit light pulses 1010 to object 106. The reflected back light pulses 1012 are then reflected back to pixel array 1014 as shown. In one example, the time-of-flight pixel cells in pixel array 1014 senses the photons from the reflected back light pulses 1012, and the corresponding signals responsive to the measured voltages from the respective capacitors included in the time-of-flight pixel cells in pixel array 1014 are then read out by read out circuitry 1018 through bitlines 1016 as shown. In some embodiments, read out circuitry 1018 may include amplifiers to further amplify the signals received through bitlines 1016. In some embodiments, the information read out by read out circuitry 1018 may then be transferred to time counters 1020, which in some embodiments can be used to keep track of time information regarding the time of flight information received from read out circuitry 1018. In some embodiments, the time counters 1020 may then output information to digital circuits included in the function logic 1008 in accordance with the teachings of the present disclosure. In some embodiments, function logic 1008 may determine the time of flight and distance information for each time-of-flight pixel cell. In some embodiments, function logic 1008 may also store the time of flight information and/or even manipulate the time of flight information (e.g., crop, rotate, adjust for background noise, or the like). In some embodiments, read out circuitry 1018 may read out an entire row of time of flight information at a time along the bitlines 1016 (illustrated), or in another example may readout the time of flight information using a variety of other techniques (not illustrated), such as a serial readout or a full parallel readout of all pixel cells simultaneously.

In the illustrated example, control circuitry 1006 is further coupled to pixel array 1014 to control the operation of pixel array 1014, as well as synchronize the operation of pixel array 1014 with adjustable frequency light source 1002. For example, control circuitry 1006 may generate the timing signals 524 coupled to be received by the charging control logic 532, as well as the output switch 506 and row select switch 514 shown in FIG. 5 to determine the time of flight information in accordance with the teachings of the present disclosure.

In one example, it is noted that time-of-flight sensing system 1000 illustrated in FIG. 10 may be implemented in a stacked chip scheme. For instance, as shown in the example, pixel array 1014 may be included in a pixel die, while read out circuitry 1018, time counters 1020, function logic 1008, and control circuitry 1006, as illustrated in FIG. 10, may be included in a separate application specific integrated circuit (ASIC) die in accordance with the teachings of the present disclosure. In the example, the pixel die and ASIC die are stacked and coupled together during fabrication to implement a time-of-flight sensing system in accordance with the teachings of the present disclosure.

Figure 11:
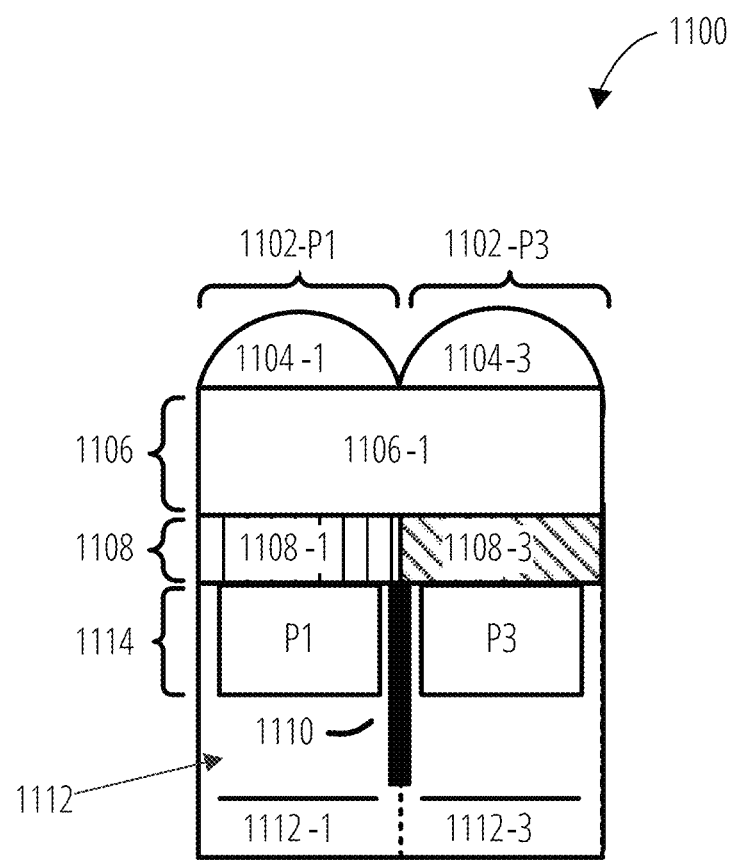
FIG. 11 illustrates a cross-sectional view of a non-limiting example embodiment of polarization pixel cells in accordance with various aspects of the present disclosure.

FIG. 11 illustrates a cross-sectional view 1100 of a non-limiting example embodiment of polarization pixel cells in accordance with various aspects of the present disclosure. Output of the polarization pixel cell 1102-P1 and the polarization pixel cell 1102-P3 may be processed and/or combined into a single polarization pixel of data. As shown, the cross-sectional view 1100 includes unshared microlenses 1104, a subpixel color filter 1106, two polarization filters 1108, two photodiodes 1114 disposed in respective portions of the semiconductor material 1112 (e.g., semiconductor material 1112-1, semiconductor material 1112-3, and the like), and an optional deep trench isolation structure 1110.

In the illustrated embodiment, a given polarization pixel cell (e.g., first polarization pixel cell 1102-P1) of a pixel array 112 includes a first photodiode (e.g., P1) disposed in a respective portion of the semiconductor material 1112 (e.g., semiconductor material 1112-1), an unshared microlens (e.g., unshared microlens 1104-1) optically aligned over the first photodiode, and a polarization filter (e.g., polarization filter 1108-1) disposed between the first photodiode and the unshared microlens. The polarization filter 1108 is configured to provide linear polarization of light incident upon the polarization filter 1108. In some embodiments, the polarization filter 1108 may be a wire grid polarizer that includes an array of thin metal lines or wires positioned along a common plane (e.g., on top of or otherwise proximate to a first side of the semiconductor material 1112 between the plurality of photodiodes 1114 and the plurality of subpixel color filters 1106 and/or plurality of unshared microlenses 1104).

The separation distance and angle of orientation of the metal lines of a given polarization filter 1108 may be configured to obtain a desired degree of linear polarization of incident light. In some embodiments the degree of polarization provided by the polarization filter 1108 may be zero, forty-five, ninety, one hundred thirty-five, or other degrees of polarization. In some embodiments, the plurality of polarization pixel cells 1102 are grouped together (e.g., polarization pixel cell 1102-P1 and polarization pixel cell 1102-P3) in a two-by-two pattern (e.g., as shown in FIG. 2-FIG. 4) for a given image pixel. In some embodiments, a group of four polarization pixel cells (e.g., as partially illustrated as P1 and P3 in FIG. 11) arranged in a two-by-two pattern may provide a degree of linear polarization of zero, forty-five, ninety, and one hundred thirty-five degrees, respectively.

As shown in FIG. 11, the plurality of polarization filters 1108 are disposed between the plurality of subpixel color filters 1106 and the plurality of photodiodes 1114. In some embodiments, the subpixel color filter 1106 is optically aligned with the polarization pixel cells 1102 and may have a spectral photoresponse corresponding to green, clear, or any other spectral photoresponse. In other embodiments, there may be no subpixel color filter 1106 optically aligned over the photodiodes associated with the plurality of polarization pixel cells 1102. In some embodiments the plurality of polarization filters 1108 have a negligible thickness such that the thickness of subpixel color filters 1106 disposed over the polarization pixel cells 1102 and other pixel cells are substantially equal. In the same or other embodiments, the plurality of subpixel color filters 1106 may be planarized such that the microlenses are substantially aligned along a common plane of the pixel array 112.

In the illustrated embodiment, the pixel array 112 includes a deep trench isolation structure 1110 (e.g., formed of an oxide within the semiconductor material 1112 such as silicon oxide) disposed between adjacent photodiodes (e.g., P1 and P3) included in the plurality of photodiodes 1114 that may reduce electrical crosstalk between photodiodes. As illustrated, the deep trench isolation structure 1110 extends into the semiconductor material 1112 beyond a depth of the plurality of photodiodes 1114. However, in other embodiments there may be shallow trench isolation structures that do not extend within the semiconductor material 1112 beyond the depth of the plurality of photodiodes 1114. In other embodiments, there may be no isolation structures disposed between the plurality of photodiodes 1114.

Figure 12:
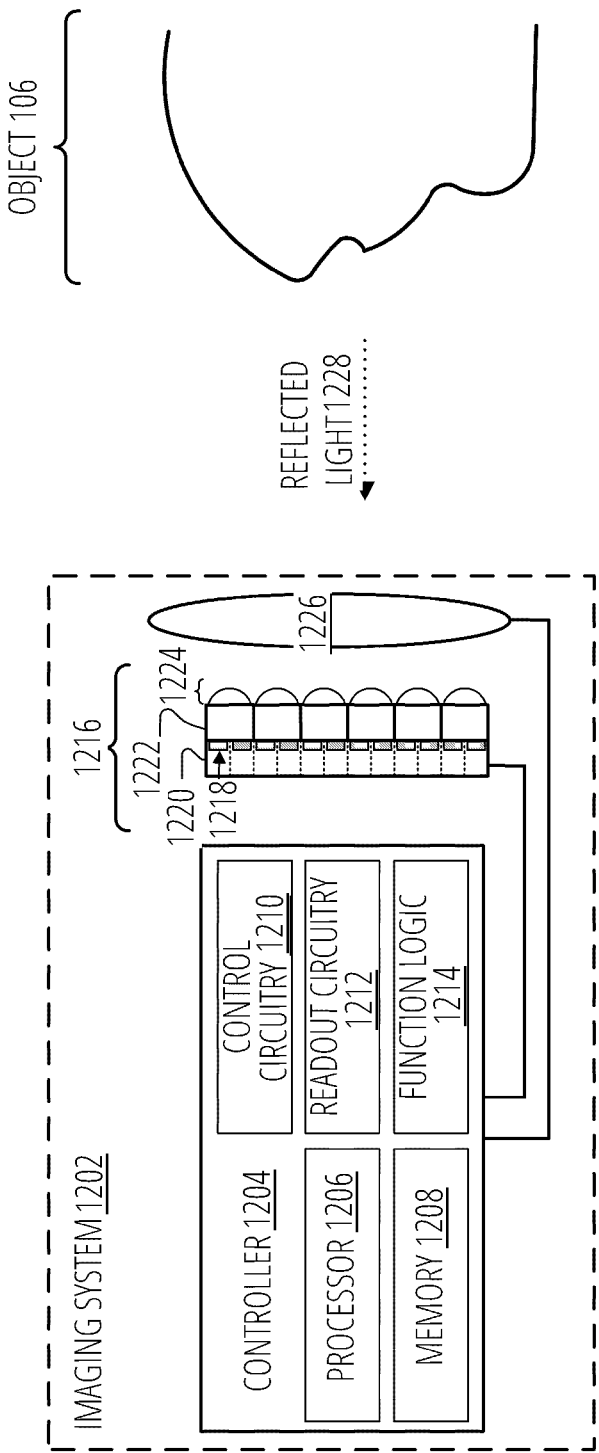
FIG. 12 is a functional block diagram of a non-limiting example embodiment of an imaging system including a pixel array with polarization pixel cells and time-of-flight pixel cells, according to various aspects of the present disclosure.

FIG. 12 is a functional block diagram of a non-limiting example embodiment of an imaging system 1202 including a pixel array 1204 with polarization pixel cells and time-of-flight pixel cells, according to various aspects of the present disclosure. Imaging system 1202 is capable of creating a three-dimensional shape image representing an object 106 in response to reflected light 1216. Imaging system 1202 includes pixel array 1204 to generate electrical or image signals in response to reflected light 1216, objective lens(es) 1214 with adjustable optical power to focus on the object 106, and controller 1218 to control, inter alia, operation of pixel array 1204 and objective lens(es) 1214. Pixel array 1204 is one possible implementation of a pixel array as illustrated in any of FIG. 1-FIG. 4 and includes a semiconductor material 1206 with a plurality of photodiodes 1208 disposed within respective portions of the semiconductor material 1206, a plurality of color filters 1210, and a plurality of microlenses 1212. In some embodiments, the pixel array 1204 includes additional components as illustrated in FIG. 5, FIG. 10, and/or FIG. 11. The controller 1218 includes one or more processors 1220, memory 1222, control circuitry 1224, readout circuitry 1226, and function logic 1228.

The controller 1218 includes logic and/or circuitry to control the operation (e.g., during pre-, post-, and in situ phases of image and/or video acquisition) of the various components of imaging system 1202. The controller 1218 may be implemented as hardware logic (e.g., application specific integrated circuits, field programmable gate arrays, system-on-chip, etc.), software/firmware logic executed on a general-purpose microcontroller or microprocessor, or a combination of both hardware and software/firmware logic. In some embodiments, the controller 1218 includes the processor 1220 coupled to memory 1222 that stores instructions for execution by the controller 1218 or otherwise by one or more components of the imaging system 1202. The instructions, when executed by the controller 1218, may cause the imaging system 1202 to perform operations that may be associated with the various functional modules, logic blocks, or circuitry of the imaging system 1202 including any one of, or a combination of, the control circuitry 1224, the readout circuitry 1226, the function logic 1228, pixel array 1204, objective lens 1214, and any other element of imaging system 1202 (illustrated or otherwise). The memory is a non-transitory computer-readable medium that may include, without limitation, a volatile (e.g., RAM) or non-volatile (e.g., ROM) storage system readable by controller 1218. It is further appreciated that the controller 1218 may be a monolithic integrated circuit, one or more discrete interconnected electrical components, or a combination thereof. Additionally, in some embodiments the one or more electrical components may be coupled to one another to collectively function as the controller 1218 for orchestrating operation of the imaging system 1202.

Control circuitry 1224 may control operational characteristics of the pixel array 1204 (e.g., exposure duration, when to capture digital images or videos, and the like). Readout circuitry 1226 reads or otherwise samples the analog signal from the individual photodiodes (e.g., read out electrical signals generated by each of the plurality of photodiodes 1208 in response to incident light to generate a phase detection auto focus signal, a depth information signal, polarization information signals, read out image signals to capture an image frame, and the like) and may include amplification circuitry, analog-to-digital (ADC) circuitry, image buffers, or otherwise. In the illustrated embodiment, readout circuitry 1226 is included in controller 1218, but in other embodiments readout circuitry 1226 may be separate from the controller 1218. In some embodiments, the pixel support circuitry 510 may be included in the readout circuitry 1226 or may otherwise be incorporated within the controller 1218.

Function logic 1228 is coupled to the readout circuitry 1226 to receive the electrical signals to generate an image in response to receiving image signals or data, determine ambiguous surface normals based on polarization information, determine rough depth maps using depth information, and disambiguate the surface normals using the depth information to generate a three-dimensional shape image, and the like. In some embodiments, the electrical or image signals may be respectively stored as three-dimensional shape data or image data and may be manipulated by the function logic 1228 (e.g., demosaic the image data, apply post image effects such as crop, rotate, adjust brightness, adjust contrast, or otherwise).

Figure 13:
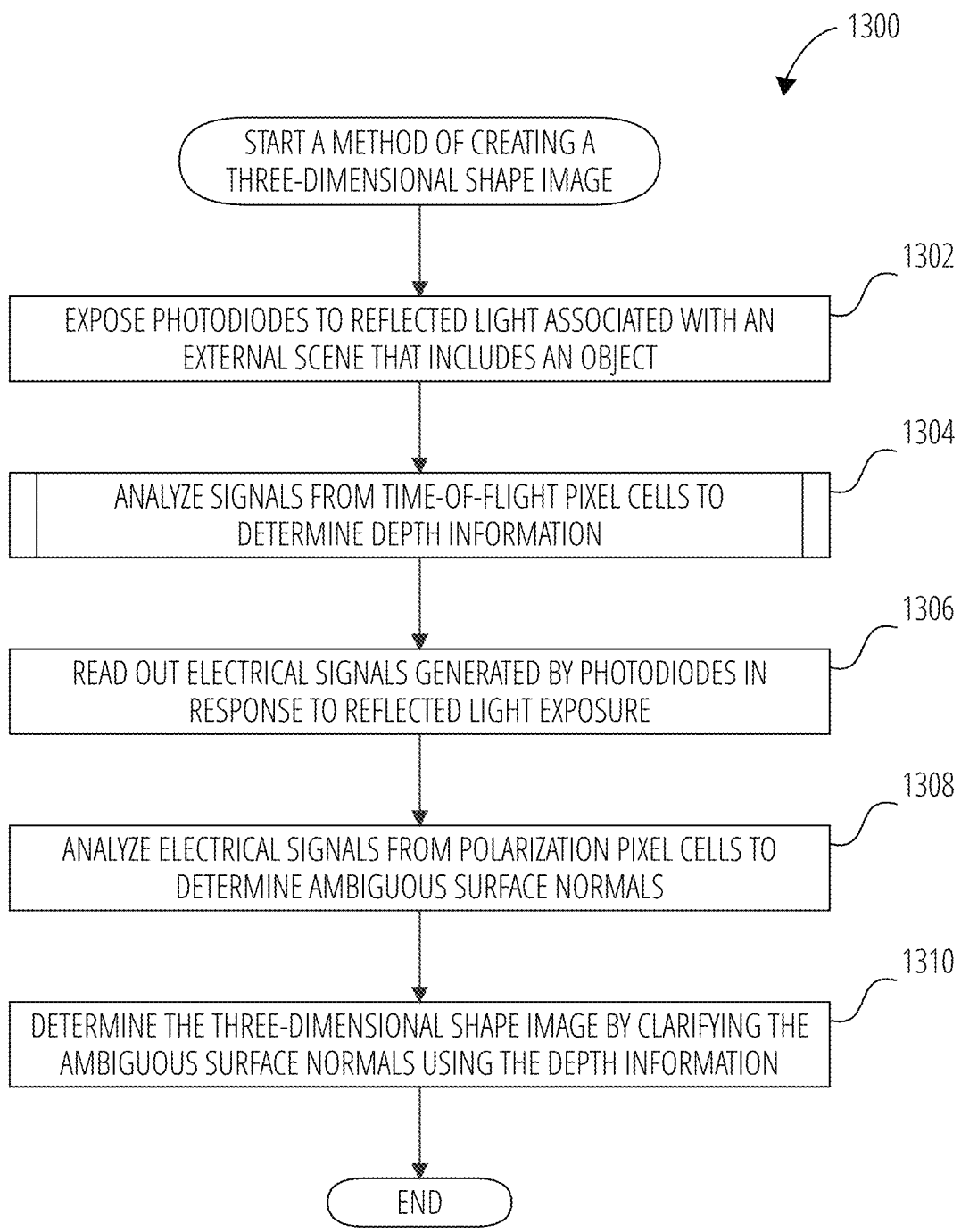
FIG. 13 is a flowchart that illustrates a non-limiting example embodiment of a method of creating a three-dimensional shape image according to various aspects of the present disclosure.

FIG. 13 is a flowchart that illustrates a non-limiting example embodiment of a method of creating a three-dimensional shape image according to various aspects of the present disclosure. In some embodiments, the method 1300 may be implemented by three-dimensional shape sensing system 100 illustrated in FIG. 1 and/or any of the image sensors or pixel arrays illustrated and described in the present disclosure. It is appreciated that the numbered blocks of the method 1300 may occur in any order and even in parallel. Additionally, blocks may be added to, or removed from, method 1300 in accordance with the teachings of the present disclosure.

At a start block, the method 1300 initializes the three-dimensional shape sensing system 100 upon receipt of a signal (e.g., a depressed shutter button of the three-dimensional shape sensing system 100, or any other suitable signal) to capture an image frame representative of an external scene that includes an object 106. During initialization, a point of interest (POI) of the external scene to be imaged by the three-dimensional shape sensing system 100 may be provided (e.g., selected by a user of the three-dimensional shape sensing system 100), automatically detected (e.g., with a phase-detection auto-focus signal), or otherwise obtained. The POI may represent a portion of the external scene that includes the object 106 for which a three-dimensional shape image is desired.

From the start block, the method 1300 proceeds to block 1302, where the plurality of photodiodes of the pixel array 112 are exposed to reflected light associated with an external scene that includes an object 106. In response to the reflected light, the plurality of photodiodes generate electrical signals proportional to the amount of reflected light received.

Figure 14:
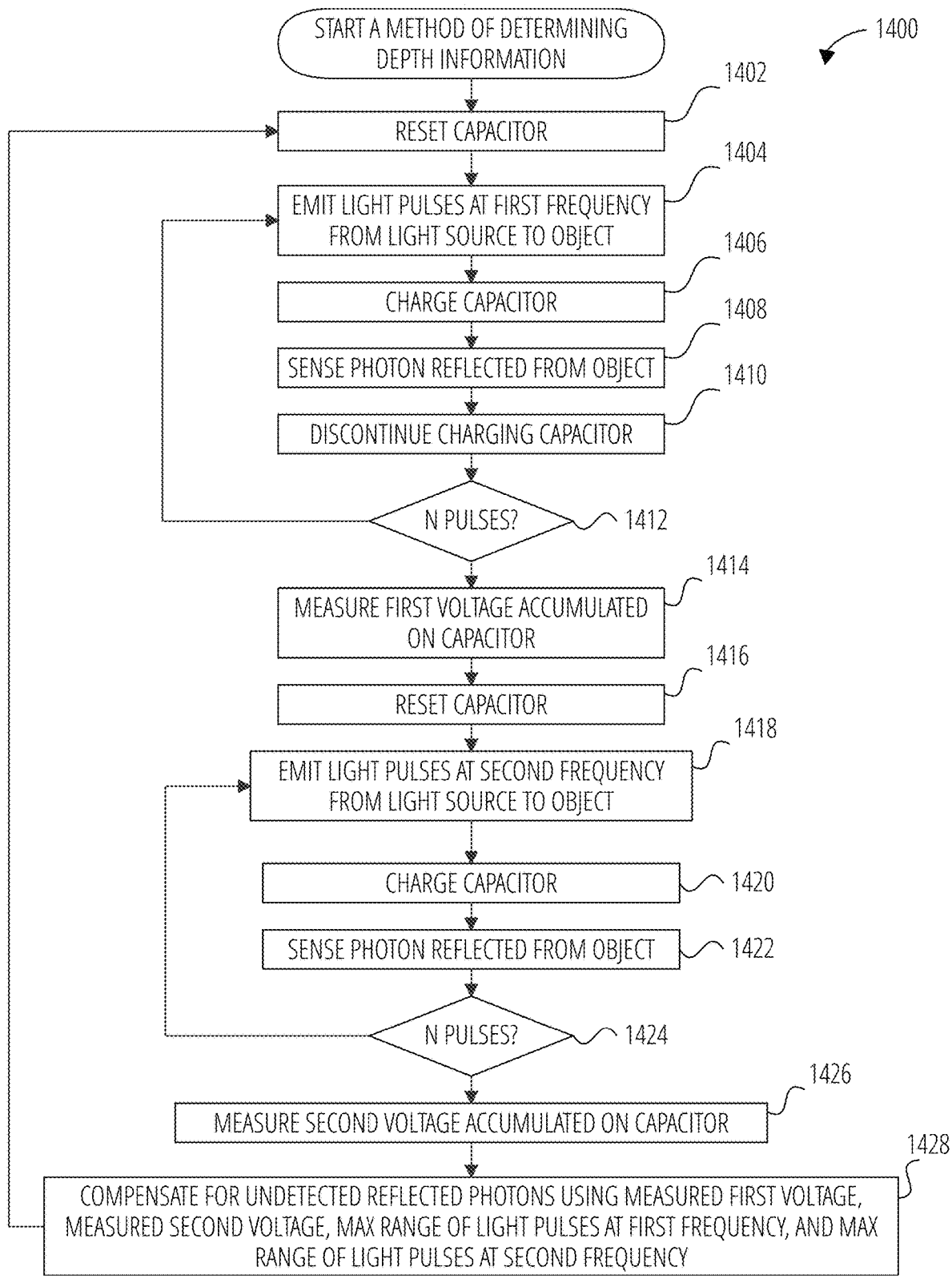
FIG. 14 is a flowchart illustrates a non-limiting example embodiment of a method of determining time-of-flight information of emitted light pulses to and from an object, and compensating for undetected reflected photons in accordance with various aspects of the present disclosure.

At subroutine block 1304, signals from the time-of-flight pixel cells are analyzed to determine depth information. Any suitable technique may be used to generate and read the signals from the time time-of-flight pixel cells. One example embodiment of such a technique is illustrated in FIG. 14 and described in detail below.

At block 1306, electrical signals are read out (e.g., via read out circuitry 1018 illustrated in FIG. 10) from the polarization pixel cells in response to the reflected light. In some embodiments, electrical signals may be read out individually from respective polarization pixel cells (e.g., by transferring the image charge generated in each of the photodiodes as an electrical signal one row at a time to column storage capacitors, and then reading out the elements individually using a column decoder coupled to a multiplexer) in response to the reflected light such that each of the electrical signals generated by a corresponding polarization pixel cell may be grouped together.

At block 1308, electrical signals from polarization pixel cells are analyzed to determine ambiguous surface normals. In some embodiments, the function logic 1228 performs the analysis. Any suitable technique may be used to obtain the ambiguous surface normals from the electrical signals from the polarization wires. For example, the intensity at a given image point, for a given polarizer angle $\phi_{pol}$, may be given as:

$$I(\phi_{pol}) = \frac{I_{max} + I_{min}}{2} + \frac{I_{max} - I_{min}}{2} \cos(2(\phi_{pol} - \phi))$$

wherein the three unknown variables in this equation are $I_{max}$, $I_{min}$, and the azimuth angle ($\varphi$). It can be seen that the azimuth angle is ambiguous, because an azimuth angle of $\varphi$ and $\varphi+\pi$ return the same value for the above equation. As another example, the azimuth angle may be determined from the Stokes vector derived from four samples from polarization photodetectors of different polarizations:

$$S_0 = \text{Intensity} = I_{tot}$$
$$S_0 = I_{0°} + I_{90°}$$
$$S_1 = I_{0°} - I_{90°}$$
$$S_2 = I_{45°} - I_{135°}$$
$$DoLP = \rho = \frac{\sqrt{S_1^2 + S_2^2}}{S_0},$$
$$DoLP \in [0, 1]$$
$$AoLP = \frac{1}{2} \arctan\left(\frac{S_2}{S_1}\right),$$
$$AoLP \in [0°, 180°]$$

The degree of linear polarization (DoLP) may be used to obtain the zenith angle of the surface normal as follows:

$$\rho = \frac{\left(n - \frac{1}{n}\right)^2 \sin^2\theta}{2 + 2n^2 - \left(n + \frac{1}{n}\right)^2 \sin^2\theta + 4\cos\theta\sqrt{n^2 - \sin^2\theta}}$$

wherein θ is the zenith angle, and n is the refractive index.

The angle of linear polarization (AoLP) may be used to obtain the ambiguous azimuth angle as follows:

$$\psi = \frac{1}{2} \begin{cases} \arctan\left(\frac{S_2}{S_1}\right) + \frac{\pi}{2}, & S_1 \geq 0. \\ \arctan\left(\frac{S_2}{S_1}\right) + \pi, & S_1 > 0 \text{ and } S_2 < S_1 \\ \arctan\left(\frac{S_2}{S_1}\right) + 0, & S_1 > 0 \text{ and } S_2 \geq S_1 \end{cases}$$

Ambiguous Azimuth Angle = $\psi$ + (0 or $\pi$)

Different techniques may be used for varying materials. For example, the above techniques may be used for imaging dielectric surfaces, while other techniques may be used for non-dielectric surfaces such as mirrors or metals.

At block 1310, a three-dimensional shape image is determined by clarifying the ambiguous surface normals using the depth information. Any suitable technique may be used to disambiguate the ambiguous azimuth angles using the depth information. For example, in some embodiments, techniques are used to generate a separate set of surface normals based on the depth information. An operator A may then be found that relates the normals based on the polarization information and the normals based on the depth information, such that the variation between the two sets of normals can be minimized as a total variation minimization problem. Once the operator A is obtained, it can be applied to disambiguate the polarization normals.

The method 1300 then proceeds to an end block and terminates.

FIG. 14 is a flowchart illustrates a non-limiting example embodiment of a method of determining time-of-flight information of emitted light pulses to and from an object, and compensating for undetected reflected photons in accordance with various aspects of the present disclosure. The item 1400 is an example of a technique suitable for use for determining depth information at subroutine block 1304 of FIG. 13.

As shown at process block 1402, the capacitor 520 in the time-of-flight pixel cell 502 circuit is reset. In one example, the capacitor 520 is initialized to a known voltage, such as for example zero volts. Block 1404 shows that light pulses are then emitted at a first frequency (e.g., freqa) from a light source 102 to an object 106. At this time, process block 1406 shows that charging then begins (or is resumed) on the capacitor 520. At process block 1408, a photon that is reflected back from the object 106 is then sensed. At this time, process block 1410 shows that the charging of the capacitor 520 is discontinued. This process continues for a plurality of n light pulses from the light source 102. As such, decision block 1412 determines whether there has yet been n light pulses emitted at the first frequency. If not, processing loops back to process block 1404. If so, processing continues to process block 1414 where a first voltage (e.g., $V_A$) accumulated on the capacitor is measured. Once the first voltage is measured, process block 1416 shows that the voltage on the capacitor 520 is then reset to initialize it for the next measurement.

Processing continues to process block 1418, which shows that light pulses are then emitted at a second frequency (e.g., freq$_b$) from the light source 102 to an object 106. The second frequency is different than the first frequency. At this time, process block 1420 shows that charging then resumed on the capacitor 520. At process block 1422, a photon that is reflected back from the object 106 is then sensed. At this time, process decision block 1424 shows that the charging of the capacitor 520 is discontinued. This process continues for a plurality of n light pulses from the light source 102. As such, decision block 1424 determines whether there has yet been n light pulses emitted at the second frequency. If not, processing loops back to process block 1418. If so, processing continues to process block 1426 where a second voltage (e.g., $V_B$) accumulated on the capacitor 520 is measured. Once the second voltage is measured, process block 1428 shows that the undetected reflected photons are compensated for by using the first voltage (e.g., $V_A$), the second voltage (e.g., $V_B$), the maximum range (e.g., $MaxRange_A$) of the light pulses at the first frequency (e.g., $freq_a$), and the maximum range (e.g., $MaxRange_B$) of the light pulses at the second frequency (e.g., $freq_b$). In one example, Equations 8 and 9 as discussed above can be used to compensate for the undetected reflected back photons in accordance with the teachings of the present disclosure.

Once these values are obtained, the time-of-flight values are derived from the obtained values, and the depth information is derived from the time-of-flight values, as discussed above. The depth information may then be provided for further processing by other components of the three-dimensional shape sensing system 100.

While the preferred embodiment of the invention has been illustrated and described, it will be appreciated that various changes can be made therein without departing from the spirit and scope of the invention. Thus, the above description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor comprising a pixel array that includes:
    a plurality of polarization pixel cells; and
    a plurality of time-of-flight pixel cells that are distinct from the plurality of polarization pixel cells;
    wherein the plurality of time-of-flight pixel cells includes a plurality of single time-of-flight pixel cells separated from each other at least one of horizontally and vertically by at least seven polarization pixel cells;
    wherein the plurality of polarization pixel cells includes groups of four polarization pixel cells arranged in two-by-two squares; and
    wherein each time-of-flight pixel cell of the plurality of single time-of-flight pixel cells is arranged within a group of four polarization pixel cells and replaces one polarization pixel cell in the group of four polarization pixel cells.

2. The imaging sensor of claim 1, wherein each time-of-flight pixel cell includes:
    a photosensor to sense photons reflected from the object; and
    pixel support circuitry including:
        charging control logic coupled to the photosensor to detect when the photosensor senses the photons reflected from the object, wherein the charging control logic is further coupled to receive timing signals representative of when light pulses are emitted from the light source to the object;
        a controllable current source coupled to provide a charge current in response to a time of flight signal coupled to be received from the charging control logic, wherein the time of flight signal is representative of a time of flight of each one of the light pulses emitted from the light source until the photosensor senses a respective one of the photons reflected from the object;
        a capacitor coupled to receive the charge current from the controllable current source in response to the time of flight signal, wherein a voltage on the capacitor is representative of a round trip distance to the object; and
        a reset circuit coupled to reset the voltage on the capacitor after being charged a plurality number of times by the controllable current source in response to the time of flight signal.

3. The image sensor of claim 1, wherein a first polarization pixel cell of each group of four polarization pixel cells is associated with polarization wires oriented in a first direction;
    wherein a second polarization pixel cell of each group of four polarization pixel cells is associated with polarization wires oriented in a second direction;
    wherein a third polarization pixel cell of each group of four polarization pixel cells is associated with polarization wires oriented in a third direction; and
    wherein a fourth polarization pixel cell of each group of four polarization pixel cells is associated with polarization wires oriented in a fourth direction.

4. The image sensor of claim 1, wherein the image sensor is configured to process polarization pixel cells in each group of four polarization pixel cells together as a pixel, and wherein the image sensor is configured to process each single time-of-flight pixel cell as a separate pixel.

5. The image sensor of claim 1, wherein the image sensor is configured to process a group of pixel cells that includes a plurality of polarization pixel cells and at least one time-of-flight pixel cell together as a pixel.

* * * * *